US012453181B2

(12) United States Patent
Lim et al.

(10) Patent No.: US 12,453,181 B2
(45) Date of Patent: *Oct. 21, 2025

(54) DISPLAY DEVICE

(71) Applicant: LG Display Co., Ltd., Seoul (KR)

(72) Inventors: Kyoung-Nam Lim, Gyeongsangbuk-do (KR); Yu-Ho Jung, Paju-si (KR); Dong-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 707 days.

This patent is subject to a terminal disclaimer.

(21) Appl. No.: 17/861,918

(22) Filed: Jul. 11, 2022

(65) Prior Publication Data

US 2022/0344626 A1 Oct. 27, 2022

Related U.S. Application Data

(63) Continuation of application No. 16/206,785, filed on Nov. 30, 2018, now Pat. No. 11,417,867.

(30) Foreign Application Priority Data

Dec. 19, 2017 (KR) .......................... 10-2017-0175082

(51) Int. Cl.
*H10D 86/40* (2025.01)
*H10D 30/67* (2025.01)
(Continued)

(52) U.S. Cl.
CPC ....... *H10D 86/423* (2025.01); *H10D 30/6723* (2025.01); *H10D 30/6755* (2025.01);
(Continued)

(58) Field of Classification Search
CPC ........................... H10K 77/111; H10D 86/423
See application file for complete search history.

(56) References Cited

U.S. PATENT DOCUMENTS 6,503,794 B1 *   1/2003   Watanabe ............ H10B 12/033
                                              257/E21.654
8,604,617 B2 *  12/2013   Furumiya ............. H01L 23/481
                                                      257/773
(Continued)

FOREIGN PATENT DOCUMENTS

CN      104332485 A     2/2015
CN      205140985 U     4/2016
(Continued)

OTHER PUBLICATIONS

China National Intellectual Property Administration, Office Action, CN Patent Application No. 201811512051.7, Dec. 5, 2022, 12 pages.
(Continued)

*Primary Examiner* — Ali Naraghi
(74) *Attorney, Agent, or Firm* — Fenwick & West LLP

(57) ABSTRACT

Disclosed is a display device that is capable of realizing low power consumption. The display device includes a first thin film transistor having a polycrystalline semiconductor layer in an active area and a second thin film transistor having an oxide semiconductor layer in the active area, thereby realizing low power consumption, wherein at least one opening disposed in a bending area has the same depth as one of a plurality of contact holes disposed in the active area, whereby the opening and the contact holes are formed through the same process, and the process is therefore simplified.

16 Claims, 23 Drawing Sheets

(51) Int. Cl.
| | |
|---|---|
| *H10D 86/60* | (2025.01) |
| *H10K 59/121* | (2023.01) |
| *H10K 59/124* | (2023.01) |
| *H10K 59/126* | (2023.01) |
| *H10K 59/131* | (2023.01) |
| *H10K 71/00* | (2023.01) |
| *H10K 77/10* | (2023.01) |
| *H10K 59/12* | (2023.01) |

(52) U.S. Cl.
CPC ......... *H10D 86/481* (2025.01); *H10D 86/60* (2025.01); *H10K 59/1213* (2023.02); *H10K 59/124* (2023.02); *H10K 59/126* (2023.02); *H10K 59/1315* (2023.02); *H10K 71/00* (2023.02); *H10K 77/111* (2023.02); *H10K 59/1201* (2023.02); *H10K 59/131* (2023.02)

(56) References Cited

U.S. PATENT DOCUMENTS

| | | | |
|---|---|---|---|
| 9,318,427 B2 | 4/2016 | Youn et al. | |
| 9,356,087 B1 | 5/2016 | Lee et al. | |
| 9,543,370 B2 | 1/2017 | Tsai et al. | |
| 9,647,052 B2 | 5/2017 | Youn et al. | |
| 9,773,853 B2 | 9/2017 | Tao et al. | |
| 9,865,670 B2 | 1/2018 | Park et al. | |
| 9,954,043 B2 | 4/2018 | Park et al. | |
| 10,032,841 B2 | 7/2018 | Tsai et al. | |
| 10,109,704 B2 | 10/2018 | Shin et al. | |
| 10,236,330 B2 | 3/2019 | Maruyama | |
| 10,297,771 B2 | 5/2019 | Choi et al. | |
| 10,475,868 B2 | 11/2019 | Park et al. | |
| 10,483,491 B2 | 11/2019 | Choi et al. | |
| 10,686,025 B2 | 6/2020 | Oh | |
| 10,797,252 B2 | 10/2020 | Choi et al. | |
| 10,803,776 B2 | 10/2020 | Huang et al. | |
| 10,896,948 B2 | 1/2021 | Lee et al. | |
| 11,417,867 B2 * | 8/2022 | Lim ................ | H10K 59/1315 |
| 2004/0036071 A1 * | 2/2004 | Yamazaki ........... | G02F 1/13454 257/E27.113 |
| 2004/0173836 A1 * | 9/2004 | Oh ..................... | H10B 12/482 257/E27.087 |
| 2011/0291168 A1 * | 12/2011 | Iwasa ................. | H10B 12/05 257/296 |
| 2014/0217373 A1 | 8/2014 | Youn et al. | |
| 2014/0306941 A1 | 10/2014 | Kim et al. | |
| 2014/0353670 A1 | 12/2014 | Youn et al. | |
| 2015/0243722 A1 | 8/2015 | Kwon et al. | |
| 2016/0064421 A1 | 3/2016 | Oh et al. | |
| 2016/0064467 A1 * | 3/2016 | Ota ..................... | H10K 59/131 257/40 |
| 2016/0079336 A1 | 3/2016 | Youn et al. | |
| 2016/0087022 A1 | 3/2016 | Tsai et al. | |
| 2016/0093644 A1 | 3/2016 | Ki et al. | |
| 2016/0172427 A1 | 6/2016 | Lee et al. | |
| 2016/0204183 A1 | 7/2016 | Tao et al. | |
| 2016/0218305 A1 | 7/2016 | Kim et al. | |
| 2016/0240605 A1 | 8/2016 | Lee et al. | |
| 2017/0040406 A1 | 2/2017 | Park et al. | |
| 2017/0062539 A1 | 3/2017 | Tsai et al. | |
| 2017/0090661 A1 | 3/2017 | Kim et al. | |
| 2017/0125505 A1 | 5/2017 | Oh | |
| 2017/0179423 A1 | 6/2017 | Kwon et al. | |
| 2017/0194404 A1 | 7/2017 | Park et al. | |
| 2017/0263888 A1 | 9/2017 | Choi et al. | |
| 2017/0271617 A1 | 9/2017 | Choi et al. | |
| 2017/0278916 A1 * | 9/2017 | Maruyama ......... | H10K 59/1213 |
| 2017/0288007 A1 | 10/2017 | Shin et al. | |
| 2017/0317299 A1 | 11/2017 | Choi et al. | |
| 2018/0204896 A1 | 7/2018 | Park et al. | |
| 2018/0233552 A1 | 8/2018 | Lee et al. | |
| 2019/0189975 A1 | 6/2019 | Lim et al. | |
| 2019/0280225 A1 | 9/2019 | Choi et al. | |
| 2019/0287433 A1 | 9/2019 | Huang et al. | |
| 2021/0028380 A1 | 1/2021 | Choi et al. | |

FOREIGN PATENT DOCUMENTS

| | | |
|---|---|---|
| CN | 105789252 A | 7/2016 |
| CN | 106972030 A | 7/2017 |
| CN | 107180924 A | 9/2017 |
| CN | 107204154 A | 9/2017 |
| CN | 107230690 A | 10/2017 |
| EP | 2 889 866 A2 | 7/2015 |
| EP | 3 174 097 A1 | 5/2017 |
| JP | 2007-318106 A | 12/2007 |
| JP | 2011-209405 A | 10/2011 |
| JP | 2012-238005 A | 12/2012 |
| JP | 2016-224118 A | 12/2016 |
| JP | 2017-120775 A | 7/2017 |
| JP | 2017-173505 A | 9/2017 |
| JP | 2019-109504 A | 7/2019 |
| KR | 10-2014-0099164 A | 8/2014 |
| KR | 10-2015-0101409 A | 9/2015 |
| KR | 10-2015-0101418 A | 9/2015 |
| KR | 10-2016-0027907 A | 3/2016 |
| KR | 10-2016-0075461 A | 6/2016 |
| KR | 10-2016-0093202 A | 8/2016 |
| KR | 10-2017-0018184 A | 2/2017 |
| KR | 10-2017-0044167 A | 4/2017 |
| KR | 10-2017-0051680 A | 5/2017 |
| KR | 10-2017-0093869 A | 8/2017 |
| KR | 10-2017-0106621 A | 9/2017 |
| KR | 10-2017-0114029 A | 10/2017 |
| KR | 10-2017-0124156 A | 11/2017 |
| KR | 10-2017-0136484 A | 12/2017 |
| WO | WO 2016/203340 A1 | 12/2016 |

OTHER PUBLICATIONS

European Patent Office, Extended European Search Report and Opinion, EP Patent Application No. 18212443.8, dated Apr. 23, 2019, eight pages.

Japan Patent Office, Notice of Reasons for Refusal, JP Patent Application No. 2020-089450, dated Mar. 2, 2021, ten pages.

Japan Patent Office, Notice of Reasons for Rejection, JP Patent Application No. 2018-228368, dated Nov. 26, 2019, four pages.

Korea Intellectual Property Office, Office Action, KR Patent Application No. 10-2017-0175082, dated May 20, 2019, 15 pages (with concise explanation of relevance).

Korean Intellectual Property Administration, Office Action, KR Patent Application No. 10-2020-0157651, dated Jan. 28, 2021, 21 pages.

United States Office Action, U.S. Appl. No. 16/206,785, filed May 14, 2020, seven pages.

United States Office Action, U.S. Appl. No. 16/206,785, filed Nov. 24, 2020, seven pages.

United States Office Action, U.S. Appl. No. 16/206,785, filed Mar. 4, 2021, seven pages.

United States Office Action, U.S. Appl. No. 16/206,785, filed Jun. 14, 2021, seven pages.

United States Office Action, U.S. Appl. No. 16/206,785, filed Aug. 27, 2021, seven pages.

United States Office Action, U.S. Appl. No. 16/206,785, filed Feb. 15, 2022, eight pages.

* cited by examiner

DISPLAY DEVICE

CROSS-REFERENCE TO RELATED APPLICATIONS

This application is a continuation of U.S. patent application Ser. No. 16/206,785 filed on Nov. 30, 2018 which claims the benefit of Republic of Korea Patent Application No. 10-2017-0175082, filed on Dec. 19, 2017, each of which is hereby incorporated by reference in its entirety.

BACKGROUND

Field of Technology

The present disclosure relates to a display device, and more particularly to a display device that is capable of realizing low power consumption.

Discussion of the Related Art

Image display devices, which are a core technology in the information and communication age and serve to display various kinds of information on a screen, have been developed such that the image display devices are thinner, lighter, and portable and exhibit high performance. As a result, flat panel display devices that have lower weight and volume than cathode ray tubes (CRT) have received a great deal of attention.

Representative examples of such flat panel display devices may include a liquid crystal display (LCD) device, a plasma display panel (PDP) device, an organic light-emitting display (OLED) device, and an electrophoretic display (ED) device.

With the active development of personal electronic devices, portable and/or wearable flat panel display devices have been developed. A display device capable of realizing low power consumption is required in order to be applied to portable and/or wearable devices. However, display devices developed to date have difficulty in realizing low power consumption.

SUMMARY

Accordingly, the present disclosure is directed to a display device that substantially obviates one or more problems due to limitations and disadvantages of the related art.

An object of the present disclosure is to provide a display device that is capable of realizing low power consumption.

Additional advantages, objects, and features of the invention will be set forth in part in the description which follows and in part will become apparent to those having ordinary skill in the art upon examination of the following, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a display device includes a first thin film transistor having a polycrystalline semiconductor layer in an active area and a second thin film transistor having an oxide semiconductor layer in the active area, thereby realizing low power consumption, wherein at least one opening disposed in a bending area has the same depth as one of a plurality of contact holes disposed in the active area, whereby the opening and the contact holes are formed through the same process, and the process is therefore simplified.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the embodiments of the present disclosure, examples of which are illustrated in the accompanying drawings.

Figure 1:
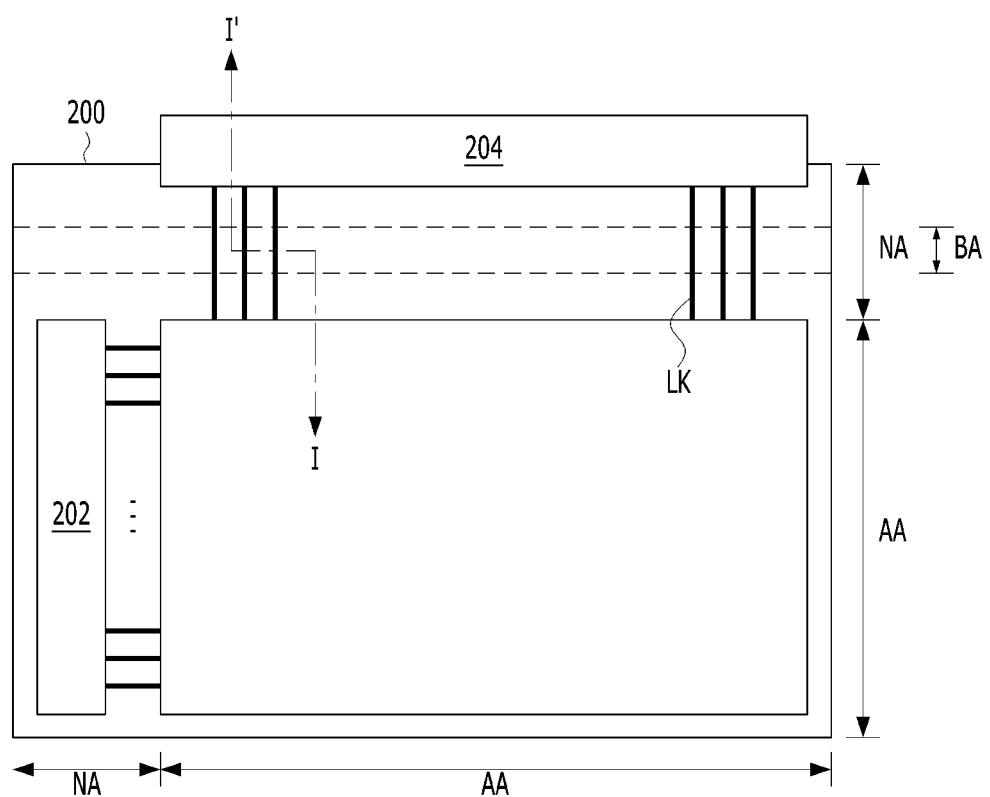
FIG. 1 is a plan view showing a display device according to the present disclosure.
Figure 2:
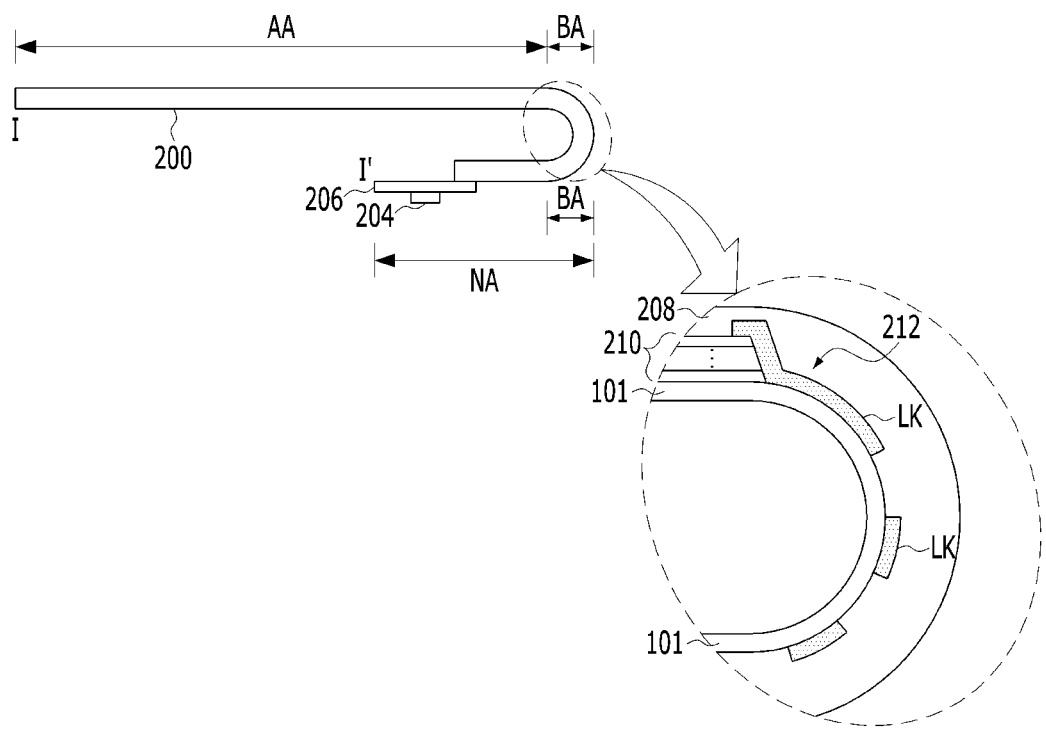
FIG. 2 is a sectional view showing the display device taken along line I-I' of FIG. 1 according to the present disclosure.

FIG. 1 is a plan view showing a display device according to the present disclosure, and FIG. 2 is a sectional view showing the display device according to the present disclosure.

The display device shown in FIGS. 1 and 2 includes a display panel 200, a scan driver 202, and a data driver 204.

The display panel 200 is divided into an active area AA provided on a substrate 101 and a non-active area NA disposed around the active area AA. The substrate 101 is made of a plastic material that exhibits high flexibility, by which the substrate 101 is bendable. For example, the substrate 101 may be made of polyimide (PI), polyethylene terephthalate (PET), polyethylene naphthalate (PEN), polycarbonate (PC), polyether sulfone (PES), polyacrylate (PAR), polysulfone (PSF), or cyclic olefin copolymer (COC).

Figure 3A:
FIGS. 3A and 3B are plan views showing subpixels disposed in an active area shown in FIG. 1 according to the present disclosure.
Figure 3B:
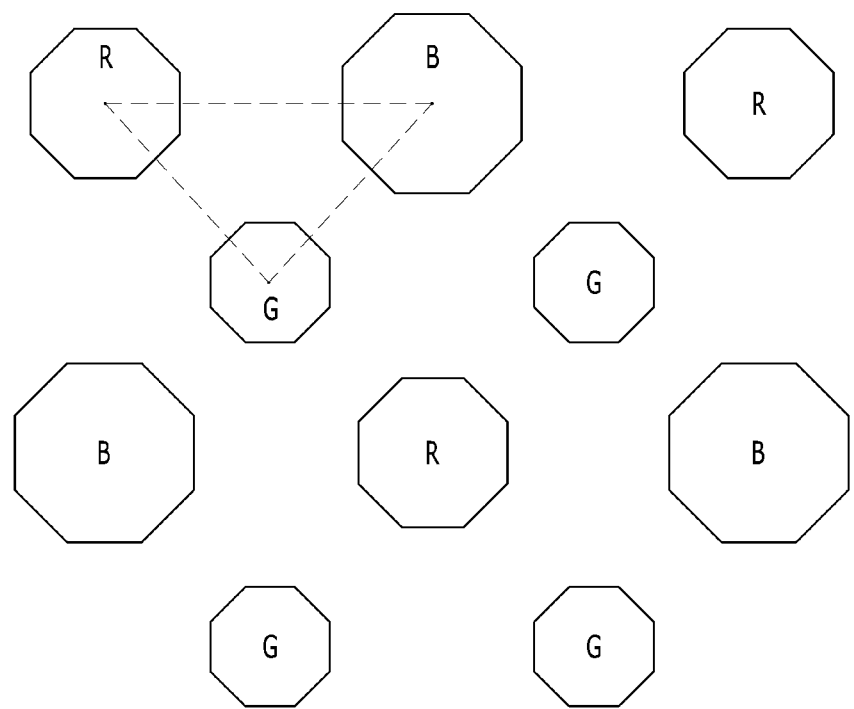

The active area AA displays an image through unit pixels arranged in a matrix form. Each unit pixel may include red (R), green (G), and blue (B) subpixels. Alternatively, each unit pixel may include red (R), green (G), blue (B), and white (W) subpixels. For example, as shown in FIG. 3A, the red (R), green (G), and blue (B) subpixels may be arranged along the same imaginary horizontal line. Alternatively, as shown in FIG. 3B, the red (R), green (G), and blue (B) subpixels may be spaced apart from each other so as to form an imaginary triangular structure.

Each subpixel includes at least one of a thin film transistor having an oxide semiconductor layer or a thin film transistor having a polycrystalline semiconductor layer. A thin film transistor having an oxide semiconductor layer and a thin film transistor having a polycrystalline semiconductor layer exhibit higher electron mobility than a thin film transistor having an amorphous semiconductor layer. Consequently, it is possible to realize high resolution and low power consumption.

At least one of the data driver 204 or the scan driver 202 may be disposed in the non-active area NA.

The scan driver 202 drives scan lines of the display panel 200. The scan driver 202 is configured using at least one of a thin film transistor having an oxide semiconductor layer or a thin film transistor having a polycrystalline semiconductor layer. The thin film transistor of the scan driver 202 is simultaneously formed in the same process as that for forming at least one thin film transistor disposed at each subpixel in the active area AA.

Figure 4A:
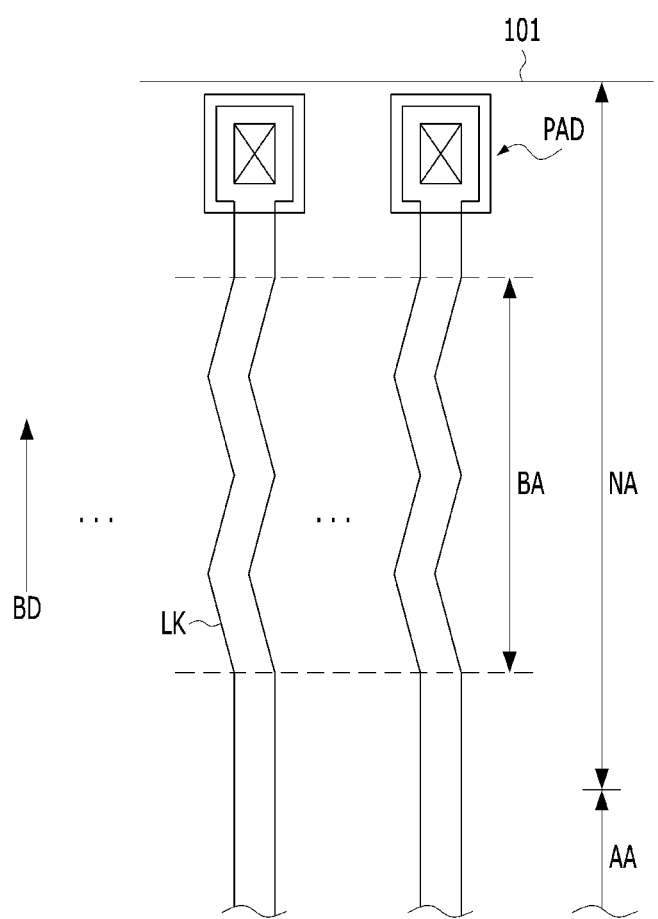
FIGS. 4A and 4B are plan views showing embodiments of a signal link disposed in a bending area shown in FIG. 1 according to the present disclosure.
Figure 4B:
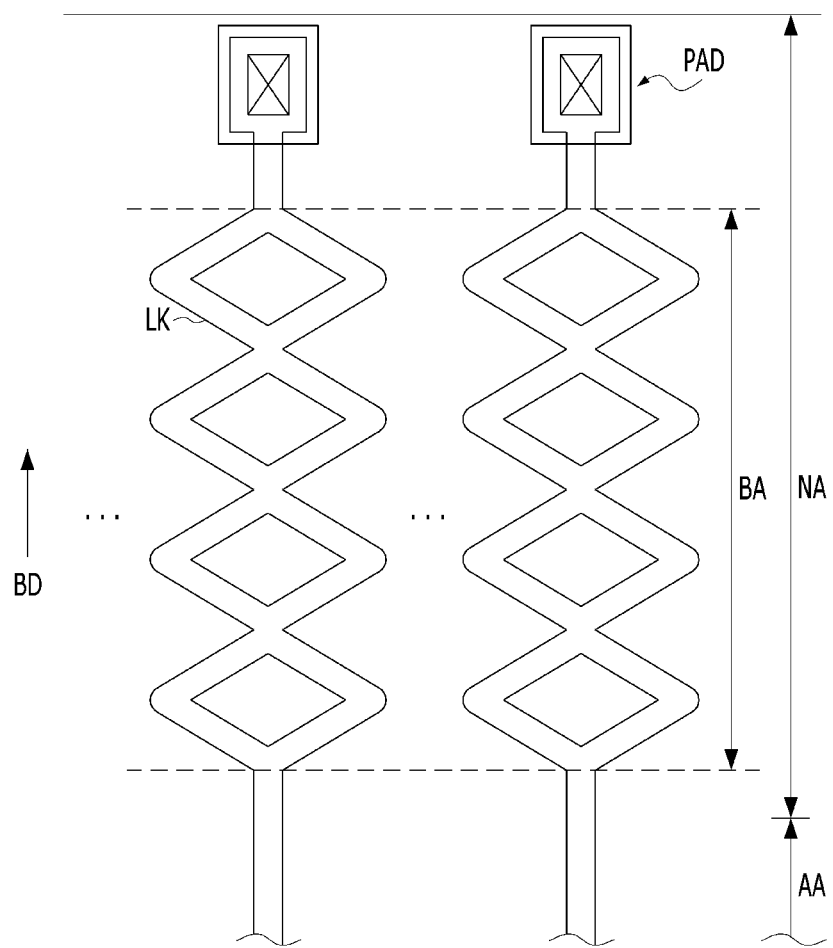

The data driver 204 drives data lines of the display panel 200. The data driver 204 is mounted on the substrate 101 in the form of a chip, or is mounted on a signal transport film 206 in the form of a chip. The data driver 204 is attached to the non-active area NA of the display panel 200. As shown in FIGS. 4A and 4B, a plurality of signal pads PAD are disposed in the non-active area NA so as to be electrically connected to the signal transport film 206. Drive signals generated from the data driver 204, the scan driver 202, a power supply unit (not shown), and a timing controller (not shown) are supplied to signal lines disposed in the active area AA via the signal pads PAD.

The non-active area NA includes a bending area BA that enables the display panel 200 to be bent or folded. The bending area BA is an area that is bent in order to locate non-display areas, such as the signal pads PAD, the scan driver 202, and the data driver 204, on the rear surface of the active area AA. As shown in FIG. 1, the bending area BA is disposed in the upper part of the non-active area NA, which is located between the active area AA and the data driver 204. Alternatively, the bending area BA may be disposed in at least one of the upper, lower, left, or right part of the non-active area NA. Consequently, the area ratio of the active area AA to the entire screen of the display device is maximized, and the area ratio of the non-active area NA to the entire screen of the display device is minimized.

A signal link LK disposed in the bending area BA connects the signal pads PAD with the signal lines disposed in the active area AA. In the case in which the signal link LK is formed in a straight line in the bending direction BD, the greatest bending stress may be applied to the signal link LK, whereby the signal link LK may be cracked or cut. According to the present disclosure, therefore, the signal link LK is configured to have a wide area in the direction that intersects the bending direction BD in order to minimize the bending stress applied to the signal link LK. To this end, as shown in FIG. 4A, the signal link LK may be formed in a zigzag shape or in the shape of a sine wave. Alternatively, as shown in FIG. 4B, the signal link LK may be formed in a shape in which a plurality of hollow diamonds is connected in a line.

In addition, as shown in FIG. 2, at least one opening 212 is disposed in the bending area BA such that the bending area BA can be easily bent. The opening 212 is formed by removing a plurality of inorganic dielectric layers 210, which are disposed in the bending area BA and form cracks in the bending area BA. Specifically, when the substrate 101 is bent, bending stress is continuously applied to the inorganic dielectric layers 210 disposed in the bending area BA. Since the inorganic dielectric layers 210 exhibit lower elasticity than an organic dielectric material, cracks may be easily formed in the inorganic dielectric layers 210. The cracks formed in the inorganic dielectric layers 210 spread to the active area AA along the inorganic dielectric layers 210, which leads to line defects and device-driving deterioration. Consequently, at least one planarization layer 208, made of an organic dielectric material that exhibits higher elasticity than the inorganic dielectric layers 210, is disposed in the bending area BA. The planarization layer 208 may reduce bending stress generated when the substrate 101 is bent, whereby the formation of cracks may be prevented. The opening 212 in the bending area BA is formed through the same mask process as that for forming at least one of a plurality of contact holes disposed in the active area AA, whereby the structure and process may be simplified.

A display device having a simplified structure and process may be applied to a display device that requires a thin film transistor, such as a liquid crystal display device or an organic light-emitting display device. Hereinafter, an embodiment of the present disclosure in which a display device having a simplified structure and process is applied to an organic light-emitting display device will be described.

Figure 5A:
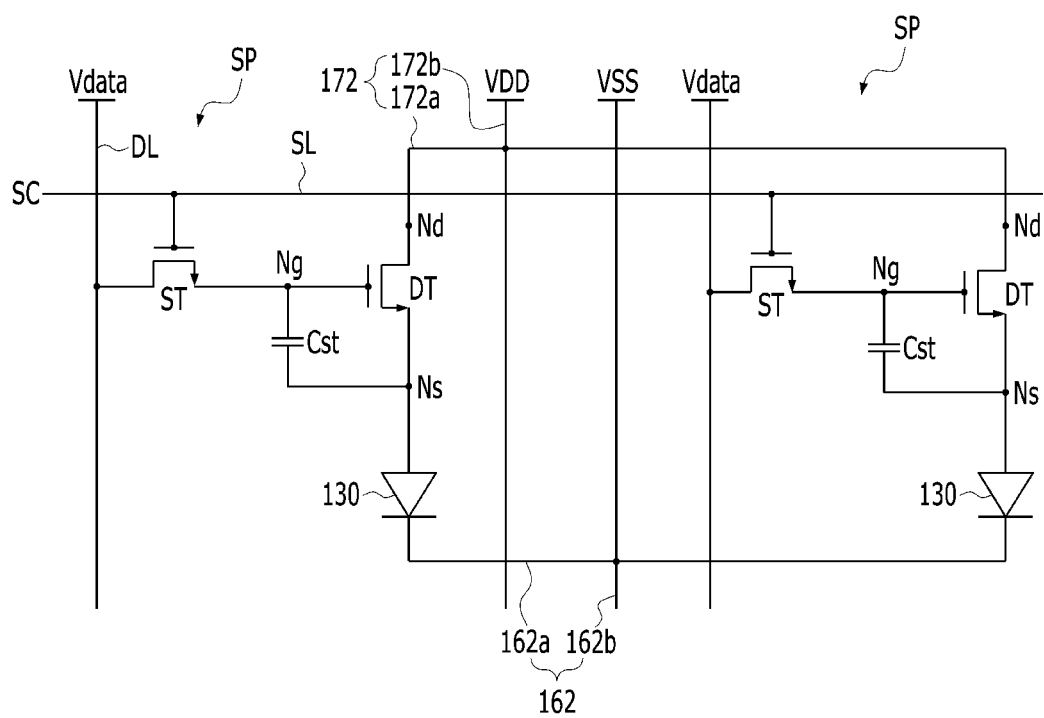
FIGS. 5A and 5B are circuit diagrams illustrating each subpixel of the display device shown in FIG. 1 according to the present disclosure.
Figure 5B:
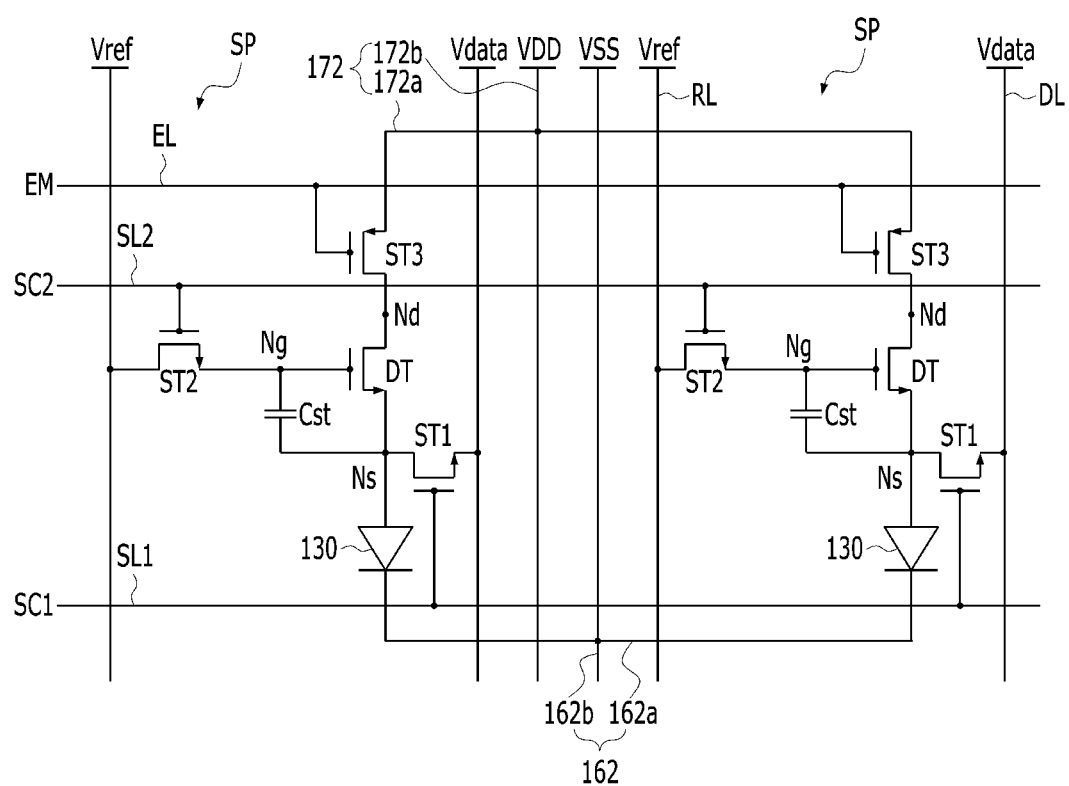

As shown in FIGS. 5A and 5B, each subpixel SP of the organic light-emitting display device includes a pixel-driving circuit and a light-emitting device 130 connected to the pixel-driving circuit.

Figure 6:
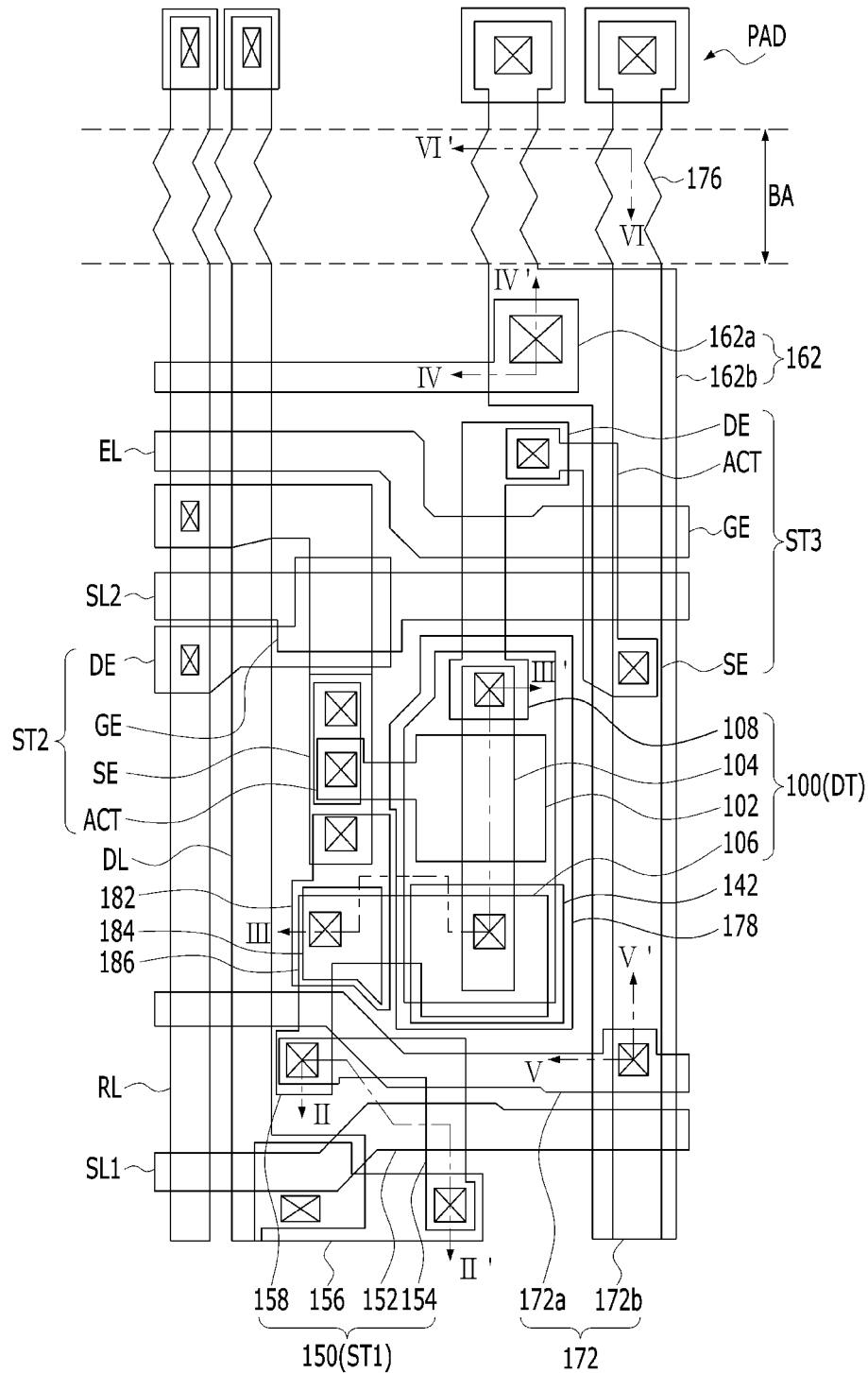
FIG. 6 is a plan view showing the subpixel shown in FIG. 5B according to the present disclosure.

As shown in FIG. 5A, the pixel-driving circuit may be configured to have a 2T1C structure having two thin film transistors ST and DT and a storage capacitor Cst. Alternatively, as shown in FIGS. 5B and 6, the pixel-driving circuit may be configured to have a 4T1C structure having four thin film transistors ST1, ST2, ST3, and DT and a storage capacitor Cst. Here, the structure of the pixel-driving circuit is not limited to the structures shown in FIGS. 5A and 5B. Various kinds of pixel-driving circuits may be used.

The storage capacitor Cst of the pixel-driving circuit shown in FIG. 5A is connected between a gate node Ng and a source node Ns in order to maintain voltage between the gate node Ng and the source node Ns uniform during a light emission period. A drive transistor DT includes a gate electrode connected to the gate node Ng, a drain electrode connected to a drain node Nd, and a source electrode connected to the light-emitting device 130. The drive transistor DT controls the magnitude of drive current based on voltage between the gate node Ng and the source node Ns. The switching transistor ST includes a gate electrode connected to a scan line SL, a drain electrode connected to a data line DL, and a source electrode connected to the gate node Ng. The switching transistor ST is turned on in response to a scan control signal SC from the scan line SL in order to supply data voltage Vdata from the data line DL to the gate node Ng. The light-emitting device 130 is connected between the source node Ns, which is connected to the source electrode of the drive transistor DT, and a low-potential supply line 162 in order to emit light based on drive current.

The pixel-driving circuit shown in FIG. 5B is substantially identical in construction to the pixel-driving circuit shown in FIG. 5A except that a drain electrode of a first switching transistor ST1 connected to a data line DL is connected to a source node Ns and that second and third switching transistors ST2 and ST3 are further provided. Consequently, a detailed description of the same construction will be omitted.

The first switching transistor ST1 shown in FIGS. 5B and 6 includes a gate electrode 152 connected to a first scan line SL1, a drain electrode 158 connected to the source node Ns, a source electrode 156 connected to the data line DL, and a semiconductor layer 154 that forms a channel between the source and drain electrodes 156 and 158. The first switching transistor ST1 is turned on in response to a scan control signal SC1 from the first scan line SL1 in order to supply data voltage Vdata from the data line DL to the source node Ns.

The second switching transistor ST2 includes a gate electrode GE connected to a second scan line SL2, a drain electrode DE connected to a reference line RL, a source electrode SE connected to a gate node Ng, and a semiconductor layer ACT that forms a channel between the source and drain electrodes SE and DE. The second switching transistor ST2 is turned on in response to a scan control signal SC2 from the second scan line SL2 in order to supply a reference voltage Vref from the reference line RL to the gate node Ng.

The third switching transistor ST3 includes a gate electrode GE connected to an emission control line EL, a drain electrode DE connected to the drain node Nd, a source electrode SE connected to a high-potential supply line 172, and a semiconductor layer ACT that forms a channel between the source and drain electrodes SE and DE. The third switching transistor ST3 is turned on in response to an emission control signal EM from the emission control line EL in order to supply high-potential voltage VDD from the high-potential supply line 172 to the drain node Nd.

Each of the high-potential supply line 172 and the low-potential supply line 162, which are included in the pixel-driving circuit, is formed in a mesh shape so as to be shared by at least two subpixels. To this end, the high-potential supply line 172 includes first and second high-potential supply lines 172a and 172b, and the low-potential supply line 162 includes first and second low-potential supply lines 162a and 162b.

Each of the second high-potential supply line 172b and the second low-potential supply line 162b is disposed parallel to the data line DL, and is provided for at least two subpixels. As shown in FIGS. 5A and 5B, the second high-potential supply line 172b and the second low-potential supply line 162b may be arranged parallel to each other. Alternatively, as shown in FIG. 6, the second high-potential supply line 172b and the second low-potential supply line 162b may be arranged parallel to each other in the upward-downward direction so as to overlap each other.

The first high-potential supply line 172a is electrically connected to the second high-potential supply line 172b, and is arranged parallel to the scan line SL. The first high-potential supply line 172a diverges from the second high-potential supply line 172b so as to intersect the second high-potential supply line 172b. Consequently, the first high-potential supply line 172a compensates for the resistance of the second high-potential supply line 172b in order to minimize the voltage drop (IR drop) of the high-potential supply line 172.

The first low-potential supply line 162a is electrically connected to the second low-potential supply line 162b, and is arranged parallel to the scan line SL. The first low-potential supply line 162a diverges from the second low-potential supply line 162b so as to intersect the second low-potential supply line 162b. Consequently, the first low-potential supply line 162a compensates for the resistance of the second low-potential supply line 162b in order to minimize the voltage drop (IR drop) of the low-potential supply line 162.

Since each of the high-potential supply line 172 and the low-potential supply line 162 is formed in a mesh shape, the number of second high-potential supply lines 172b and second low-potential supply lines 162b that are disposed in the vertical direction may be reduced. Since a larger number of subpixels may be disposed in proportion to the reduced number of second high-potential supply lines 172b and second low-potential supply lines 162b, an aperture ratio and resolution are improved.

One of the transistors included in the pixel-driving circuit includes a polycrystalline semiconductor layer, and each of the other transistors includes an oxide semiconductor layer. The switching transistor ST of the pixel-driving circuit shown in FIG. 5A is constituted by a first thin film transistor 150 having a polycrystalline semiconductor layer 154, and the drive transistor DT is constituted by a second thin film transistor 100 having an oxide semiconductor layer 104, as shown in FIG. 7. In addition, each of the first and third switching transistors ST1 and ST3 of the pixel-driving circuit shown in FIGS. 5B and 6 is constituted by a first thin film transistor 150 having a polycrystalline semiconductor layer 154, and each of the second switching transistor ST2 and the drive transistor DT is constituted by a second thin film transistor 100 having an oxide semiconductor layer 104. According to the present disclosure, as described above, a second thin film transistor 100 having an oxide semiconductor layer 104 is applied to the drive transistor DT of each subpixel, and a first thin film transistor 150 having a polycrystalline semiconductor layer 154 is applied to the switching transistor ST of each subpixel, whereby power consumption may be reduced.

The first thin film transistor 150 shown in FIGS. 6 and 7 includes a polycrystalline semiconductor layer 154, a first gate electrode 152, a first source electrode 156, and a first drain electrode 158.

The polycrystalline semiconductor layer 154 is formed on a lower buffer layer 112. The polycrystalline semiconductor layer 154 includes a channel area, a source area, and a drain area. The channel area overlaps the first gate electrode 152 in the state in which a lower gate dielectric film 114 is interposed there between so as to be formed between the first source and first drain electrodes 156 and 158. The source area is electrically connected to the first source electrode 156 via a first source contact hole 160S. The drain area is electrically connected to the first drain electrode 158 via a first drain contact hole 160D. Since the polycrystalline semiconductor layer 154 exhibits higher mobility than the amorphous semiconductor layer, thereby exhibiting low consumption and high reliability, the polycrystalline semiconductor layer 154 is suitable for being applied to the switching transistor ST of each subpixel and the scan driver 202 that drives the scan line SL. A multi buffer layer 140 and a lower buffer layer 112 are disposed between the polycrystalline semiconductor layer 154 and the substrate 101. The multi buffer layer 140 delays the diffusion of moisture and/or oxygen permeating the substrate 101. The multi buffer layer 140 is formed by alternately stacking silicon nitride (SiNx)

and silicon oxide (SiOx) at least once. The lower buffer layer 112 protects the polycrystalline semiconductor layer 154 and blocks the introduction of various kinds of defects from the substrate 101. The lower buffer layer 112 may be made of a-Si, silicon nitride (SiNx), or silicon oxide (SiOx).

The first gate electrode 152 is formed on the lower gate dielectric film 114. The first gate electrode 152 overlaps the channel area of the polycrystalline semiconductor layer 154 in the state in which the lower gate dielectric film 114 is disposed there between. The first gate electrode 152 may be made of the same material as a storage lower electrode 182, such as one of molybdenum (Mo), aluminum (Al), chrome (Cr), gold (Au), titanium (Ti), nickel (Ni), neodymium (Nd), and copper (Cu) or an alloy thereof, and may have a single-layered structure or a multi-layered structure. However, the present disclosure is not limited thereto.

First and second lower interlayer dielectric films 116 and 118 located on the polycrystalline semiconductor layer 154 are made of an inorganic film having higher hydrogen particle content than an upper interlayer dielectric film 124. For example, the first and second lower interlayer dielectric films 116 and 118 are made of silicon nitride (SiNx) formed by deposition using NH3 gas, and the upper interlayer dielectric film 124 is made of silicon oxide (SiOx). During a hydrogenation process, the hydrogen particles contained in the first and second lower interlayer dielectric films 116 and 118 are diffused to the polycrystalline semiconductor layer 154, whereby apertures in the polycrystalline semiconductor layer 154 are filled with hydrogen. Consequently, the polycrystalline semiconductor layer 154 becomes stabilized, thereby preventing a reduction in the properties of the first thin film transistor 150.

The first source electrode 156 is connected to the source area of the polycrystalline semiconductor layer 154 via the first source contact hole 160S, which is formed through the lower gate dielectric film 114, the first and second lower interlayer dielectric films 116 and 118, an upper buffer layer 122, and the upper interlayer dielectric film 124. The first drain electrode 158 faces the first source electrode 156, and is connected to the drain area of the polycrystalline semiconductor layer 154 via the first drain contact hole 160D, which is formed through the lower gate dielectric film 114, the first and second lower interlayer dielectric films 116 and 118, the upper buffer layer 122, and the upper interlayer dielectric film 124. Since the first source and first drain electrodes 156 and 158 are made of the same material as a storage supply line 186 and are formed in the same plane as the storage supply line 186, the first source and first drain electrodes 156 and 158 may be simultaneously formed through the same mask process as that for forming the storage supply line 186.

After activation and hydrogenation of the polycrystalline semiconductor layer 154 of the first thin film transistor 150, the oxide semiconductor layer 104 of the second thin film transistor 100 is formed. That is, the oxide semiconductor layer 104 is located on the polycrystalline semiconductor layer 154. As a result, the oxide semiconductor layer 104 is not exposed to a high-temperature atmosphere during the activation and hydrogenation of the polycrystalline semiconductor layer 154. Consequently, damage to the oxide semiconductor layer 104 is prevented, whereby the reliability of the oxide semiconductor layer 104 is improved.

The second thin film transistor 100 is disposed on the upper buffer layer 122 so as to be spaced apart from the first thin film transistor 150. The second thin film transistor 100 includes a second gate electrode 102, an oxide semiconductor layer 104, a second source electrode 106, and a second drain electrode 108.

The second gate electrode 102 overlaps the oxide semiconductor layer 104 in the state in which an upper gate dielectric pattern 146 is disposed there between. The second gate electrode 102 is formed in the same plane as the first high-potential supply line 172a, i.e. on the upper gate dielectric pattern 146, and is made of the same material as the first high-potential supply line 172a. Consequently, the second gate electrode 102 and the first high-potential supply line 172a may be formed through the same mask process, whereby the number of mask processes may be reduced.

The oxide semiconductor layer 104 is formed on the upper buffer layer 122 so as to overlap the second gate electrode 102 such that a channel is formed between the second source electrode 106 and the second drain electrode 108. The oxide semiconductor layer 104 is made of an oxide including at least one of Zn, Cd, Ga, In, Sn, Hf, or Zr. Since the second thin film transistor 100 including the oxide semiconductor layer 104 exhibits higher charge mobility and lower leakage of current than the first thin film transistor 150 including the polycrystalline semiconductor layer 154, the second thin film transistor 100 may be applied to the switching and drive thin film transistors ST and DT, each of which has a short on time and a long off time.

The upper interlayer dielectric film 124 and the upper buffer layer 122, which are adjacent to the upper part and the lower part of the oxide semiconductor layer 104, respectively, are made of an inorganic film that has lower hydrogen particle content than the lower interlayer dielectric films 116 and 118. For example, the upper interlayer dielectric film 124 and the upper buffer layer 122 may be made of silicon oxide (SiOx), and the lower interlayer dielectric films 116 and 118 may be made of silicon nitride (SiNx). During heat treatment of the oxide semiconductor layer 104, therefore, hydrogen in the lower interlayer dielectric films 116 and 118 and hydrogen in the polycrystalline semiconductor layer 154 may be prevented from spreading to the oxide semiconductor layer 104.

The second source and second drain electrodes 106 and 108 may be formed on the upper interlayer dielectric film 124, may be made of one of molybdenum (Mo), aluminum (Al), chrome (Cr), gold (Au), titanium (Ti), nickel (Ni), neodymium (Nd), and copper (Cu) or an alloy thereof, and may have a single-layered structure or a multi-layered structure. However, the present disclosure is not limited thereto.

The second source electrode 106 is connected to a source area of the oxide semiconductor layer 104 via a second source contact hole 110S, which is formed through the upper interlayer dielectric film 124. The second drain electrode 108 is connected to a drain area of the oxide semiconductor layer 104 via a second drain contact hole 110D, which is formed through the upper interlayer dielectric film 124. The second source and second drain electrodes 106 and 108 are formed so as to face each other in the state in which a channel area of the oxide semiconductor layer 104 is disposed there between.

As shown in FIG. 7, a storage lower electrode 182 and a storage upper electrode 184 overlap each other in the state in which the first lower interlayer dielectric film 116 is disposed there between in order to form a storage capacitor Cst (180).

The storage lower electrode 182 is connected to one of the second gate electrode 102 and the second source electrode 106 of the drive transistor DT. The storage upper electrode 184 is located on the lower gate dielectric film 114, is formed in the same layer as the first gate electrode 152, and is made of the same material as the first gate electrode 152.

The storage upper electrode 184 is connected to the other of the second gate electrode 102 and the second source electrode 106 of the drive transistor DT via the storage supply line 186. The storage upper electrode 184 is located on the first lower interlayer dielectric film 116. The storage upper electrode 184 is formed in the same layer as a light-blocking layer 178 and the first low-potential supply line 162a, and is made of the same material as the light-blocking layer 178 and the first low-potential supply line 162a. The storage upper electrode 184 is exposed through a storage contact hole 188, which is formed through the second lower interlayer dielectric film 118, the upper buffer layer 122, and the upper interlayer dielectric film 124, so as to be connected to the storage supply line 186. Meanwhile, the storage upper electrode 184 may be integrally connected to the light-blocking layer 178, although the storage upper electrode 184 is shown in FIG. 7 as being spaced apart from the light-blocking layer 178.

The first lower interlayer dielectric film 116, which is disposed between the storage lower electrode 182 and the storage upper electrode 184, is made of an inorganic dielectric material, such as SiOx or SiNx. In one embodiment, the first lower interlayer dielectric film 116 is made of SiNx, which exhibits higher permittivity than SiOx. Consequently, the storage lower electrode 182 and the storage upper electrode 184 overlap each other in the state in which the first lower interlayer dielectric film 116, which is made of SiNx exhibiting high permittivity, is disposed there between, whereby the capacitance value of the storage capacitor Cst, which is proportional to permittivity, is increased.

The light-emitting device 130 includes an anode 132 connected to the second source electrode 106, at least one light-emitting stack 134 formed on the anode 132, and a cathode 136 on the light-emitting stack 134.

The anode 132 is connected to a pixel connection electrode 142, which is exposed through a second pixel contact hole 144, which is formed through a second planarization layer 128. Here, the pixel connection electrode 142 is connected to the second source electrode 106, which is exposed through a first pixel contact hole 120, which is formed through a first planarization layer 126.

The anode 132 is formed to have a multi-layered structure including a transparent conductive film and an opaque conductive film, which exhibits high reflectance. The transparent conductive film is made of a material that has a relatively large work function value, such as indium-tin-oxide (ITO) or indium-zinc-oxide (IZO). The opaque conductive film is made of Al, Ag, Cu, Pb, Mo, Ti, or an alloy thereof, and has a single-layered or multi-layered structure. For example, the anode 132 is formed to have a structure in which a transparent conductive film, an opaque conductive film, and a transparent conductive film are sequentially stacked, or a structure in which a transparent conductive film and an opaque conductive film are sequentially stacked. The anode 132 is disposed on the second planarization layer 128 so as to overlap a circuit area in which the first and second thin-film transistors 150 and 100 and the storage capacitor (Cst) 180 are disposed, as well as a light-emitting area defined by a bank 13, whereby the light emission size is increased.

The light-emitting stack 134 is formed by a hole-related layer, an organic light-emitting layer, and an electron-related layer on the anode 132 in the forward sequence or in the reverse sequence. In addition, the light-emitting stack 134 may include first and second light-emitting stacks, which are opposite to each other in the state in which a charge generation layer is disposed there between. In this case, the organic light-emitting layer of one of the first and second light-emitting stacks generates blue light, and the organic light-emitting layer of the other of the first and second light-emitting stacks generates yellow-green light, whereby white light is generated through the first and second light-emitting stacks. The white light generated by the light-emitting stack 134 is incident on a color filter (not shown), which is located on the light-emitting stack 134, whereby a color image may be realized. Alternatively, each light-emitting stack 134 may generate colored light corresponding to each subpixel without using a separate color filter in order to realize a color image. That is, a light-emitting stack 134 of a red (R) subpixel may generate red light, a light-emitting stack 134 of a green (G) subpixel may generate green light, and a light-emitting stack 134 of a blue (B) subpixel may generate blue light.

The bank 138 is formed so as to expose the anode 132 of each subpixel. The bank 138 may be made of an opaque material (e.g. black) in order to prevent optical interference between neighboring subpixels. In this case, the bank 138 includes a light-blocking material made of at least one of color pigment, organic black, or carbon.

The cathode 136 is formed on the upper surface and the side surface of the light-emitting stack 134 so as to be opposite to the anode 132 in the state in which the light-emitting stack 134 is disposed there between. In the case in which the display device according to the present disclosure is applied to a front emission type organic light-emitting display device, the cathode 136 is made of a transparent conductive film, such as indium-tin-oxide (ITO) or indium-zinc-oxide (IZO).

The cathode 136 is electrically connected to the low-potential supply line 162. As shown in FIGS. 5B and 6, the low-potential supply line 162 includes first and second low-potential supply lines 162a and 162b, which intersect each other. As shown in FIG. 7, the first low-potential supply line 162a is formed on the first lower interlayer dielectric film 116, which is the same layer as the storage upper electrode 184, and is made of the same material as the storage upper electrode 184. The second low-potential supply line 162b is formed on the first planarization layer 126, which is the same layer as the pixel connection electrode 142, and is made of the same material as the pixel connection electrode 142. The second low-potential supply line 162b is electrically connected to the first low-potential supply line 162a, which is exposed through a first line contact hole 164, which is formed through the second lower interlayer dielectric film 118, the upper buffer layer 122, the upper interlayer dielectric film 124, and the first planarization layer 126.

As shown in FIGS. 5B and 6, the high-potential supply line 172, which supplies high-potential voltage VDD, which is higher than the low-potential voltage VSS supplied through the low-potential supply line 162, includes first and second high-potential supply lines 172a and 172b, which intersect each other. As shown in FIG. 7, the first high-potential supply line 172a is formed on the upper gate dielectric pattern 146, which is the same layer as the second gate electrode 102, and is made of the same material as the second gate electrode 102. The second high-potential supply line 172b is formed on the upper interlayer dielectric film 124, which is the same layer as the second source and second drain electrodes 106 and 108, and is made of the same material as the second source and second drain electrodes 106 and 108. The second high-potential supply line 172b is electrically connected to the first high-potential supply line 172a, which is exposed through a second line contact hole 174, which is formed through the upper interlayer dielectric film 124.

Figure 7A:
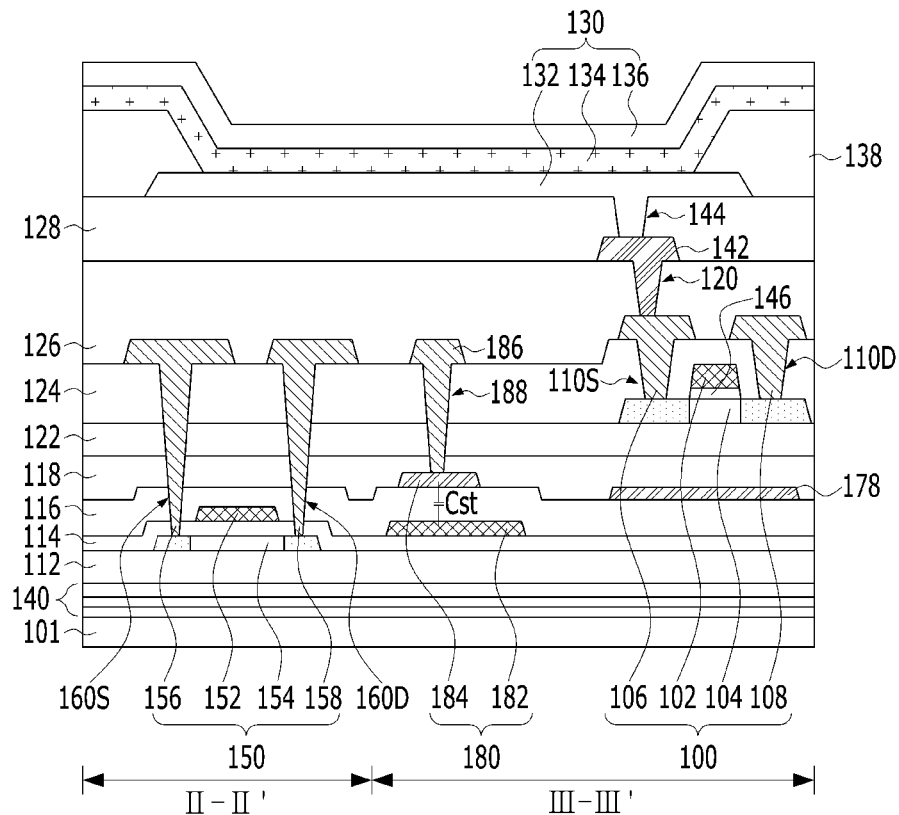
FIG. 7A is a sectional view showing an organic light-emitting display device taken along lines II-II' and III-III' of FIG. 6.
Figure 7B:
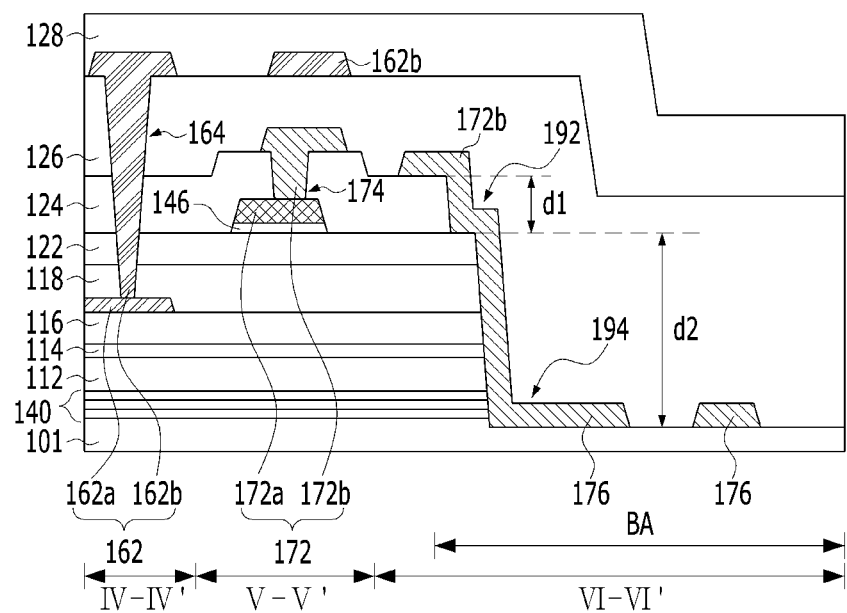
FIG. 7B is a sectional view showing an organic light-emitting display device taken along lines IV-IV', V-V', and VI-VI' of FIG. 6 according to the present disclosure.
Figure 8A:
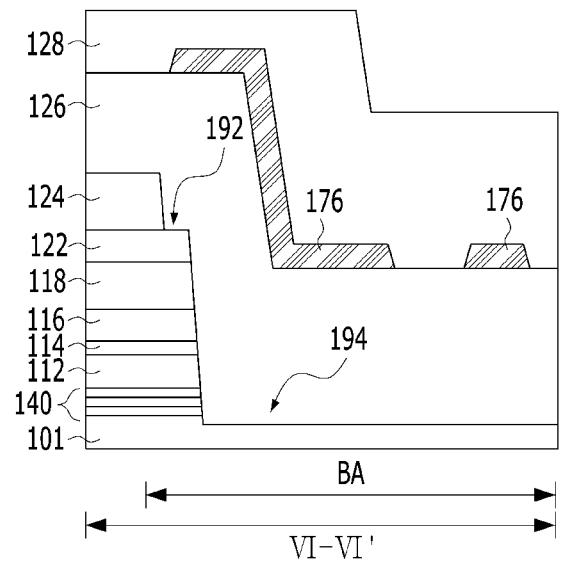
FIGS. 8A and 8B are sectional views showing other embodiments of a bending area shown in FIG. 7 according to the present disclosure.
Figure 8B:
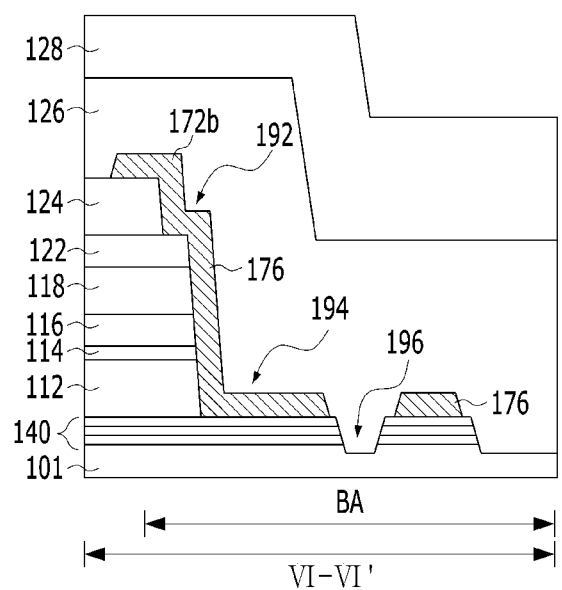

A signal link 176, which is connected to at least one of the low-potential supply line 162, the high-potential supply line 172, the data line DL, the scan line SL, or the emission control line EL, is formed so as to cross the bending area BA, in which first and second openings 192 and 194 are disposed. The first opening 192 exposes the side surface of the upper interlayer dielectric film 124 and the upper surface of the upper buffer layer 122. The first opening 192 is formed so as to have the same depth d1 as at least one of the second source contact hole 110S or the second drain contact hole 110D. The second opening 194 is formed so as to expose a portion of the substrate 101 and the side surfaces of the multi buffer layer 140, the lower buffer layer 112, the lower gate dielectric film 114, the first and second lower interlayer dielectric films 116 and 118, and the upper buffer layer 122. The second opening 194 is formed so as to have a greater depth d2 than at least one of the first source contact hole 160S or the first drain contact hole 160D or to have the same depth d2 as at least one of the first source contact hole 160S or the first drain contact hole 160D. As shown in FIGS. 7A, 7B, and 8A, the sum of the thicknesses of the multi buffer layer 140 and the lower buffer layer 112 has the same thickness as the upper interlayer dielectric film 124 or has a larger thickness than the upper interlayer dielectric film 124. As shown in FIG. 8B, the lower buffer layer 112 has the same thickness as the upper interlayer dielectric film 124 or has a larger thickness than the upper interlayer dielectric film 124. Consequently, the multi buffer layer 140, the lower buffer layer 112, the lower gate dielectric film 114, the first and second lower interlayer dielectric films 116 and 118, the upper buffer layer 122, and the upper interlayer dielectric film 124 are removed from the bending area BA by the first and second openings 192 and 194. That is, the inorganic dielectric layers 140, 112, 114, 116, 118, 122, and 124, which form cracks in the bending area BA, are removed from the bending area BA, whereby the substrate 101 may be easily bent without forming cracks.

As shown in FIGS. 7A and 7B, the signal link 176 may be formed together with the source and drain electrodes 106, 156, 108, and 158 through the same mask process as that for forming the source and drain electrodes 106, 156, 108, and 158. In this case, the signal link 176 is made of the same material as the source and drain electrodes 106, 156, 108, and 158, and is formed in the same plane as the source and drain electrodes 106, 156, 108, and 158, i.e. on the upper interlayer dielectric film 124. In addition, the signal link 176 is formed on the substrate 101 so as to contact the substrate 101. Consequently, the signal link 176 is formed on the side surface of the upper interlayer dielectric film 124 and the upper surface of the upper buffer layer 122, which are exposed through the first opening 192, and is formed on the side surfaces of the multi buffer layer 140, the lower buffer layer 112, the lower gate dielectric film 114, the first and second lower interlayer dielectric films 116 and 118, and the upper buffer layer 122, which are exposed through the second opening 194. As a result, the signal link 176 is formed in the shape of stairs. In order to cover the signal link 176 formed on the upper interlayer dielectric film 124 and the substrate 101, at least one of the first or second planarization layer 126 or 128 is disposed on the signal link 176, or an encapsulation film or an inorganic encapsulation layer constituted by an encapsulation stack including a combina- tion of inorganic or organic encapsulation layers is disposed on the signal link 176 without the first and second planarization layers 126 and 128.

In addition, as shown in FIG. 8A, the signal link 176 may be formed together with the pixel connection electrode 142 through the same mask process as that for forming the pixel connection electrode 142. In this case, the signal link 176 is made of the same material as the pixel connection electrode 142, and is formed in the same plane as the pixel connection electrode 142, i.e. on the first planarization layer 126. In order to cover the signal link 176 formed on the first planarization layer 126, the second planarization layer 128 is disposed on the signal link 176, or an encapsulation film or an inorganic encapsulation layer constituted by an encapsulation stack including a combination of inorganic or organic encapsulation layers is disposed on the signal link 176, without the second planarization layer 128.

In addition, as shown in FIG. 8B, the signal link 176 may be formed on the multi buffer layer 140. In this case, the multi buffer layer 140 disposed between signal links 176 is removed such that the substrate can be easily bent without forming cracks in the substrate, whereby a trench 196, through which the substrate 101 is exposed, is formed between the signal links 176.

Meanwhile, at least one moisture-blocking hole (not shown) formed through the first and second planarization layers 126 and 128 may be disposed in the bending area BA. The moisture-blocking hole is formed in at least one of a space between the signal links 176 or the upper parts of the signal links 176. The moisture-blocking hole prevents external moisture from permeating into the active area AA through at least one of the first or second planarization layer 126 or 128 disposed on the signal link 176. In addition, an inspection line (not shown) that is used during an inspection process is formed so as to have the same structure as one of the signal links 176 shown in FIGS. 7 to 8B.

FIGS. 9A to 9M are sectional views illustrating a method of manufacturing the organic light-emitting display device shown in FIG. 7.

Figure 9A:
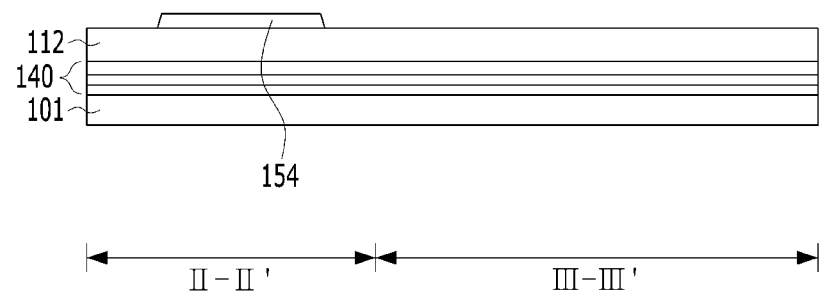
FIGS. 9A to 9M are sectional views illustrating a method of manufacturing the organic light-emitting display device shown in FIG. 7.
Figure 9A:
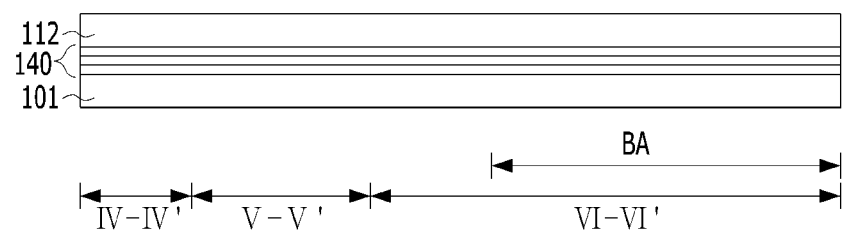

Referring to FIG. 9A, a multi buffer layer 140, a lower buffer layer 112, and a polycrystalline semiconductor layer 154 are sequentially formed on a substrate 101.

Specifically, SiOx and SiNx are alternately stacked at least once on the substrate 101 in order to form a multi buffer layer 140. Subsequently, SiOx or SiNx is deposited on the entire surface of the multi buffer layer 140 in order to form a lower buffer layer 112. Subsequently, an amorphous silicon thin film is formed on the substrate 101, on which the lower buffer layer 112 is formed, by low-pressure chemical vapor deposition (LPCVD) or plasma-enhanced chemical vapor deposition (PECVD). Subsequently, the amorphous silicon thin film is crystallized into a polycrystalline silicon thin film. The polycrystalline silicon thin film is patterned through a photolithography and etching process using a first mask in order to form a polycrystalline semiconductor layer 154.

Figure 9B:
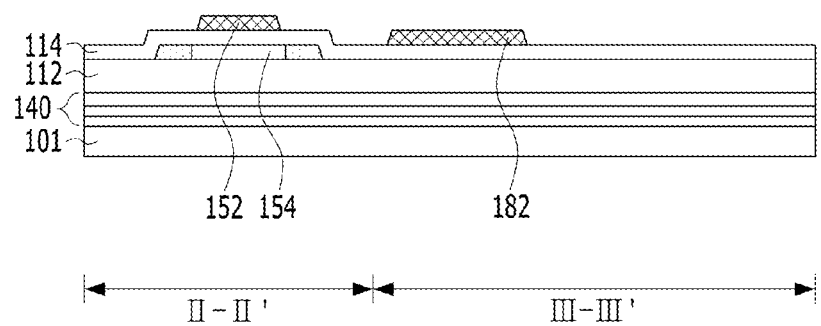
Figure 9B:
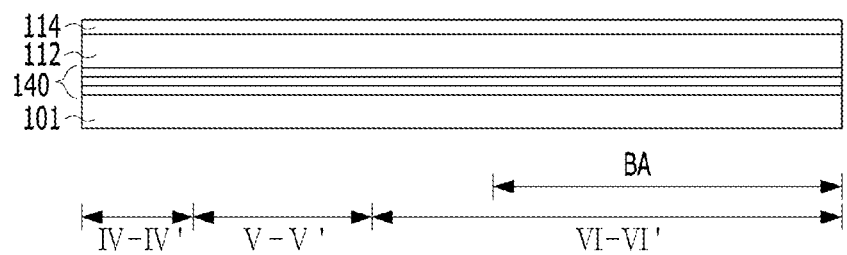

Referring to FIG. 9B, a lower gate dielectric film 114 is formed on the substrate 101, on which the polycrystalline semiconductor layer 154 is formed, and a first gate electrode 152 and a storage lower electrode 182 are formed on the lower gate dielectric film 114.

Specifically, an inorganic dielectric material, such as SiNx or SiOx, is deposited on the entire surface of the substrate 101, on which the polycrystalline semiconductor layer 154 is formed, in order to form a lower gate dielectric film 114. Subsequently, a first conductive layer is deposited on the entire surface of the lower gate dielectric film 114, and is patterned through a photolithography and etching process using a second mask in order to form a first gate electrode 152 and a storage lower electrode 182. Subsequently, the polycrystalline semiconductor layer 154 is doped with a dopant through a doping process using the first gate electrode 152 as a mask in order to form source and drain areas, which do not overlap the first gate electrode 152, and a channel area, which overlaps the first gate electrode 152.

Figure 9C:
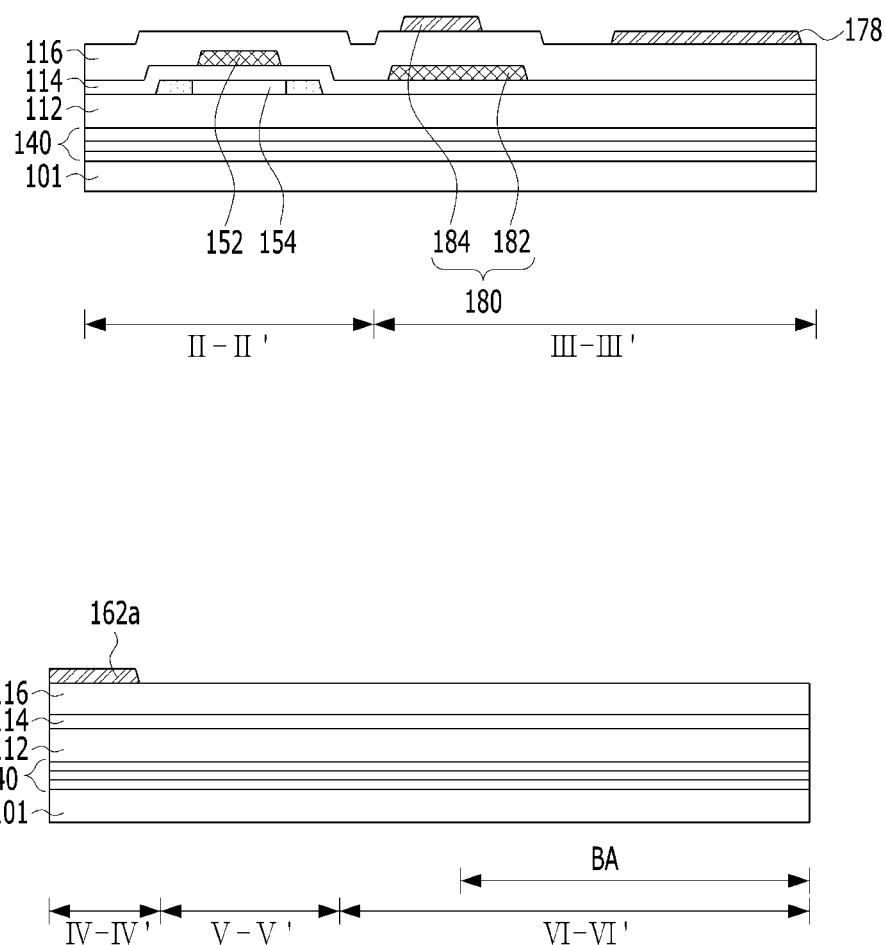

Referring to FIG. 9C, at least one layer of first lower interlayer dielectric film 116 is formed on the substrate 101, on which the first gate electrode 152 and the storage lower electrode 182 are formed, and a storage upper electrode 184, a light-blocking layer 178, and a first low-potential supply line 162a are formed on the first lower interlayer dielectric film 116.

Specifically, an inorganic dielectric material, such as SiNx or SiOx, is deposited on the entire surface of the substrate 101, on which the first gate electrode 152 and the storage lower electrode 182 are formed, in order to form a first lower interlayer dielectric film 116. Subsequently, a second conductive layer is deposited on the entire surface of the first lower interlayer dielectric film 116, and is patterned through a photolithography and etching process using a third mask in order to form a storage upper electrode 184, a light-blocking layer 178, and a first low-potential supply line 162a.

Figure 9D:
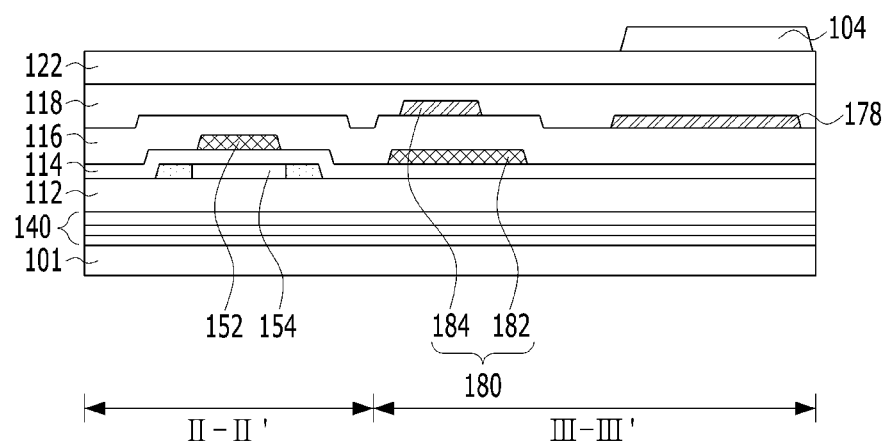
Figure 9D:
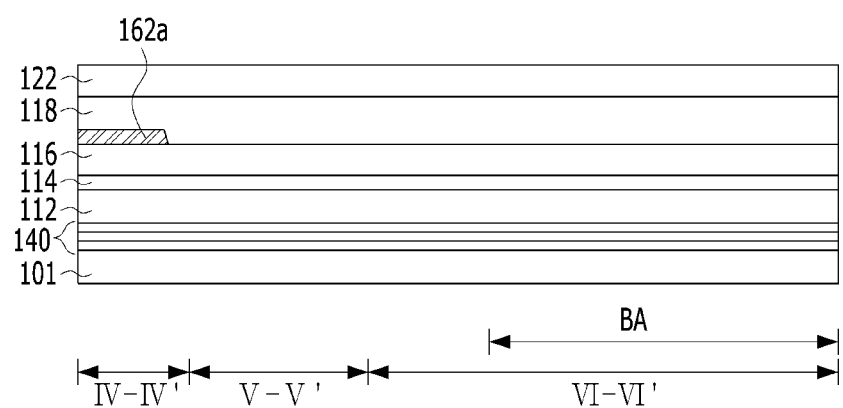

Referring to FIG. 9D, at least one layer of second lower interlayer dielectric film 118 and an upper buffer layer 122 are sequentially formed on the substrate 101, on which the storage upper electrode 184, the light-blocking layer 178, and the first low-potential supply line 162a are formed, and an oxide semiconductor layer 104 is formed on the upper buffer layer 122.

Specifically, an inorganic dielectric material, such as SiNx or SiOx, is deposited on the entire surface of the substrate 101, on which the storage upper electrode 184, the light-blocking layer 178, and the first low-potential supply line 162a are formed, in order to form a second lower interlayer dielectric film 118. Subsequently, an inorganic dielectric material, such as SiNx or SiOx, is deposited on the entire surface of the second lower interlayer dielectric film 118 in order to form an upper buffer layer 122. Subsequently, an oxide semiconductor layer 104 is deposited on the entire surface of the upper buffer layer 122, and is patterned through a photolithography and etching process using a fourth mask in order to form an oxide semiconductor layer 104, which overlaps the light-blocking layer 178.

Figure 9E:
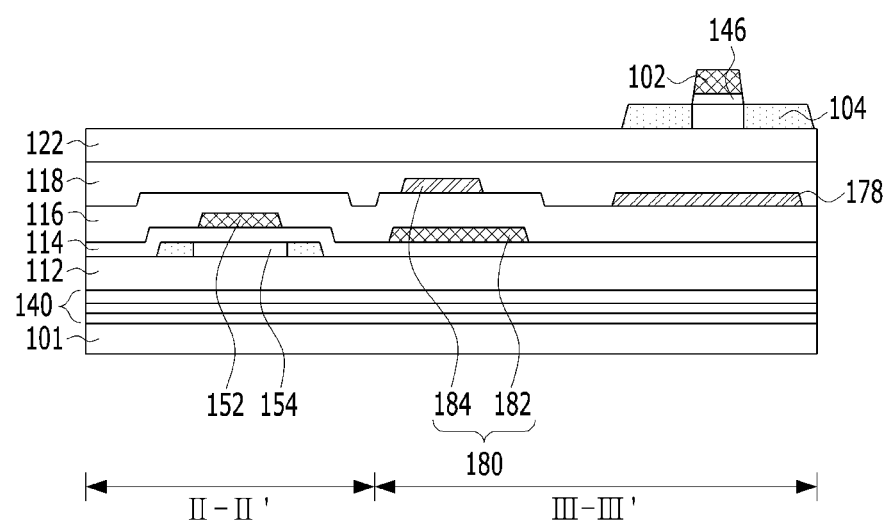
Figure 9E:
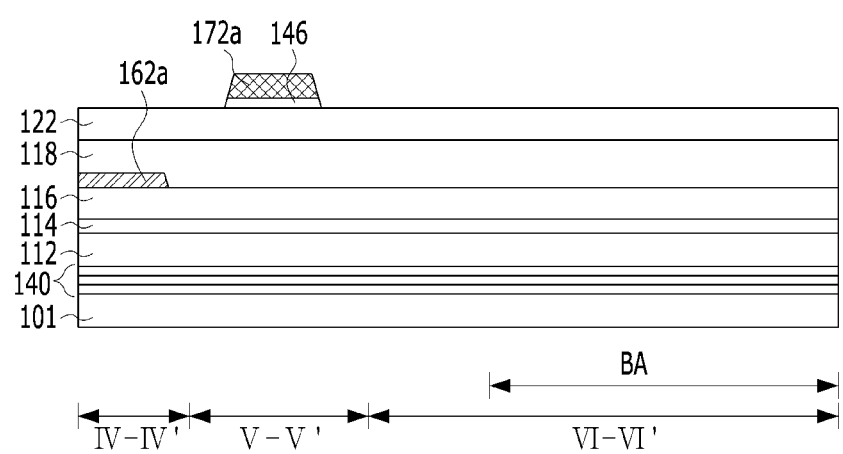

Referring to FIG. 9E, an upper gate dielectric pattern 146, a second gate electrode 102, and a first high-potential supply line 172a are formed on the substrate 101, on which the oxide semiconductor layer 104 is formed.

Specifically, an upper gate dielectric film is formed on the substrate 101, on which the oxide semiconductor layer 104 is formed, and a third conductive layer is formed thereon by deposition, such as sputtering. The upper gate dielectric film is made of an inorganic dielectric material, such as SiOx or SiNx. The third conductive layer is made of Mo, Ti, Cu, AlNd, Al, Cr, or an alloy thereof, and has a single-layered or multi-layered structure. Subsequently, the third conductive layer and the upper gate dielectric film are simultaneously patterned through a photolithography and etching process using a fifth mask in order to form a second gate electrode 102 and a first high-potential supply line 172a and to form an upper gate dielectric pattern 146 thereunder so as to have the same pattern. At this time, during dry etching of the upper gate dielectric film, the portion of the oxide semiconductor layer 104 that does not overlap the second gate electrode 102 is exposed to plasma, and oxygen in the oxide semiconductor layer 104 exposed to plasma is removed as the result of reacting with plasma. Consequently, the portion of the oxide semiconductor layer 104 that does not overlap the second gate electrode 102 becomes a conductor to constitute source and drain areas.

Figure 9F:
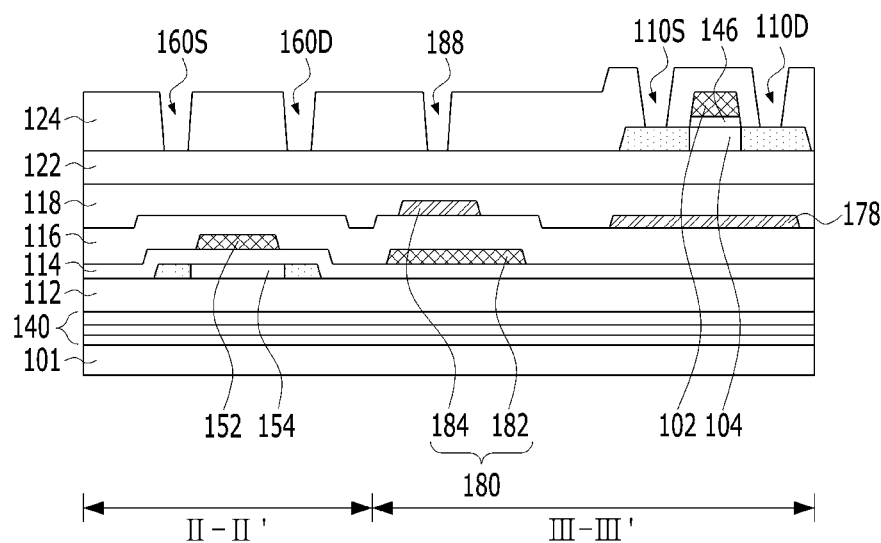
Figure 9F:
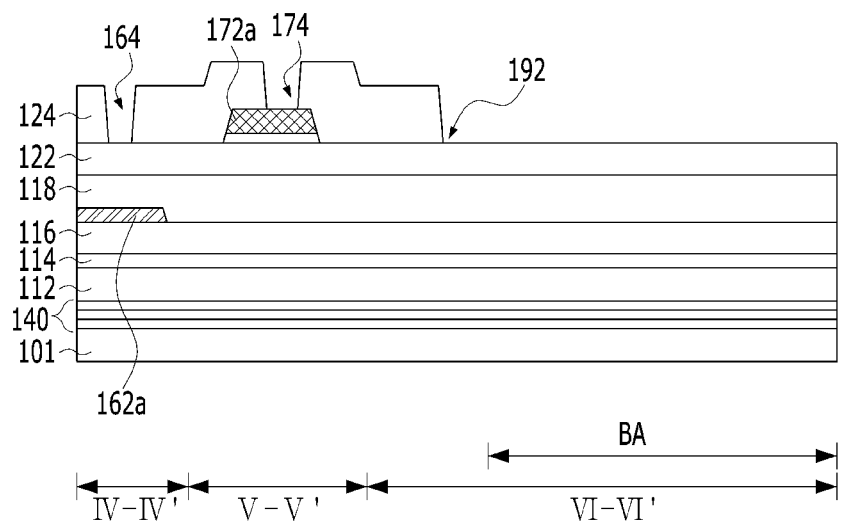

Referring to FIG. 9F, an upper interlayer dielectric film 124, having therein a first opening 192, first and second source contact holes 160S and 110S, first and second drain contact holes 160D and 110D, a first storage contact hole 188, and first and second line contact holes 164 and 174, is formed on the substrate 101, on which the upper gate dielectric pattern 146, the second gate electrode 102, and the first high-potential supply line 172a are formed.

Specifically, an inorganic dielectric material, such as SiNx or SiOx, is deposited on the entire surface of the substrate 101, on which the upper gate dielectric pattern 146, the second gate electrode 102, and the first high-potential supply line 172a are formed, in order to form an upper interlayer dielectric film 124. Subsequently, the upper interlayer dielectric film 124 is patterned through a photolithography and etching process using a sixth mask in order to form first and second source contact holes 160S and 110S, first and second drain contact holes 160D and 110D, a first storage contact hole 188, and first and second line contact holes 164 and 174. In addition, the portion of the upper interlayer dielectric film 124 in a bending area BA is removed to form a first opening 192. At this time, the first and second source contact holes 160S and 110S, the first and second drain contact holes 160D and 110D, the first storage contact hole 188, the first and second line contact holes 164 and 174, and the first opening 192 are formed through the upper interlayer dielectric film 124 so as to have the same depth.

Figure 9G:
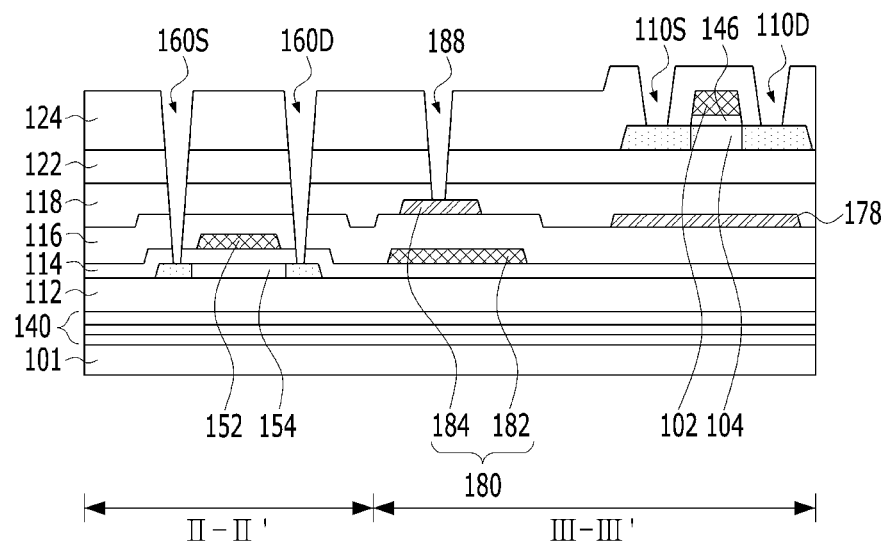
Figure 9G:
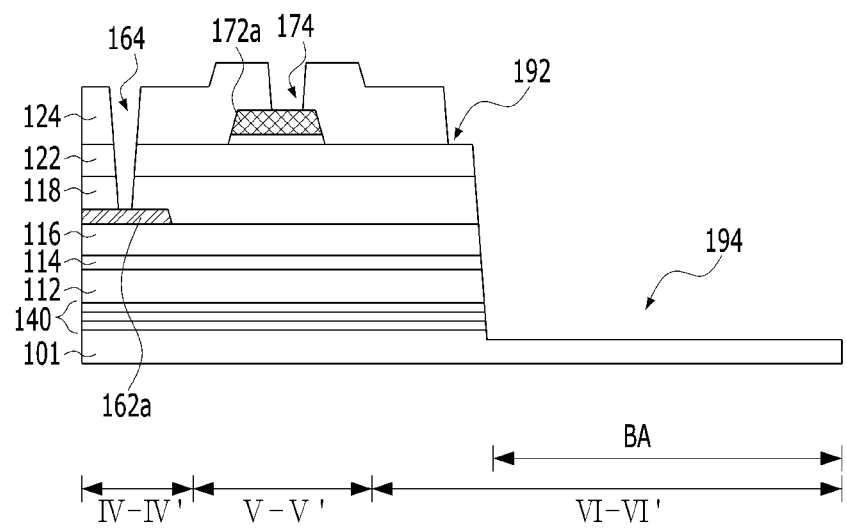

Referring to FIG. 9G, a second opening 194 is formed in the bending area BA on the substrate 101, on which the upper interlayer dielectric film 124 is formed, and the lower gate dielectric film 114, the first and second lower interlayer dielectric films 116 and 118, and the upper buffer layer 122 in the first source contact hole 160S, the first drain contact hole 160D, the first storage contact hole 188, and the first line contact hole 164 are selectively removed.

Specifically, the lower gate dielectric film 114, the first and second lower interlayer dielectric films 116 and 118, and the upper buffer layer 122 in the first source contact hole 160S, the first drain contact hole 160D, the first storage contact hole 188, and the first line contact hole 164 are removed from the substrate 101, on which the upper interlayer dielectric film 124 is formed, through a photolithography and etching process using a seventh mask. At the same time, the multi buffer layer 140, the lower buffer layer 112, the lower gate dielectric film 114, the first and second lower interlayer dielectric films 116 and 118, and the upper buffer layer 122 in the bending area are removed in order to form a second opening 194. That is, the lower gate dielectric film 114, the first and second lower interlayer dielectric films 116 and 118, and the upper buffer layer 122 in the first source contact hole 160S and the first drain contact hole 160D are removed, and the second lower interlayer dielectric film 118 and the upper buffer layer 122 in the first storage contact hole 188 and the first line contact hole 164 are removed.

Figure 9H:
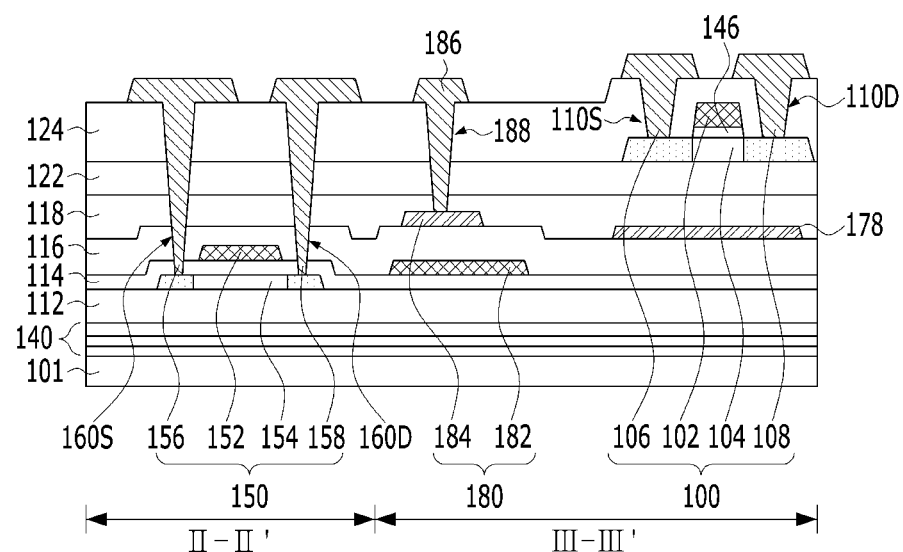
Figure 9H:
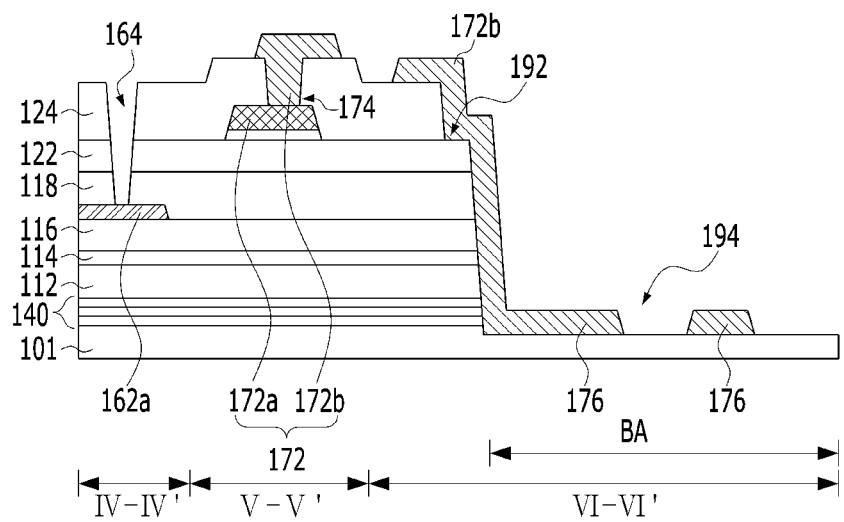

Referring to FIG. 9H, first and second source electrodes 156 and 106, first and second drain electrodes 158 and 108, a storage supply line 186, a second high-potential supply line 172b, and a signal link 176 are formed on the substrate 101, on which the second opening 194 is formed.

Specifically, a fourth conductive layer, made of Mo, Ti, Cu, AlNd, Al, Cr, or an alloy thereof, is deposited on the entire surface of the substrate 101, on which the second opening 194 is formed. Subsequently, the fourth conductive layer is patterned through a photolithography and etching process using an eighth mask in order to form first and second source electrodes 156 and 106, first and second drain electrodes 158 and 108, a storage supply line 186, a second high-potential supply line 172b, and a signal link 176.

Figure 9I:
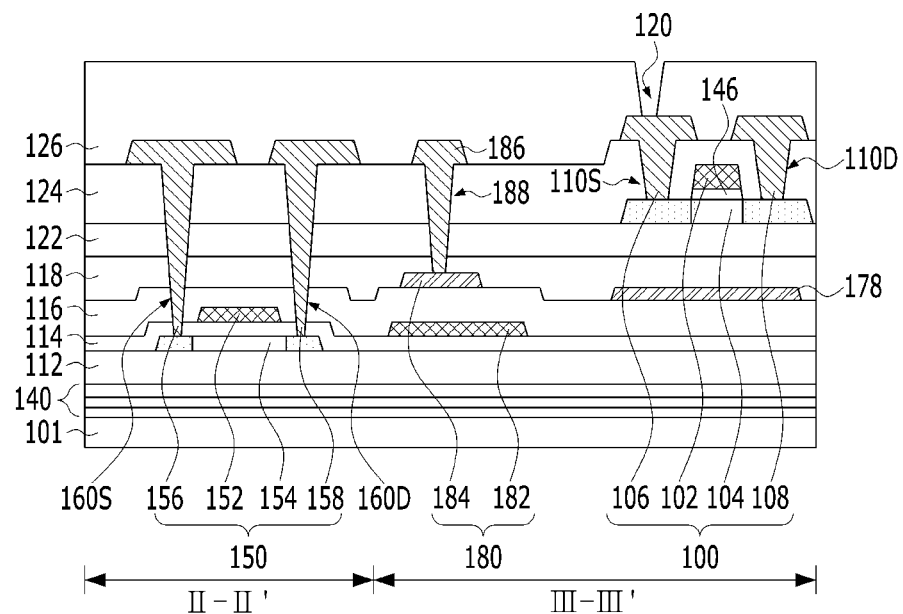
Figure 9I:
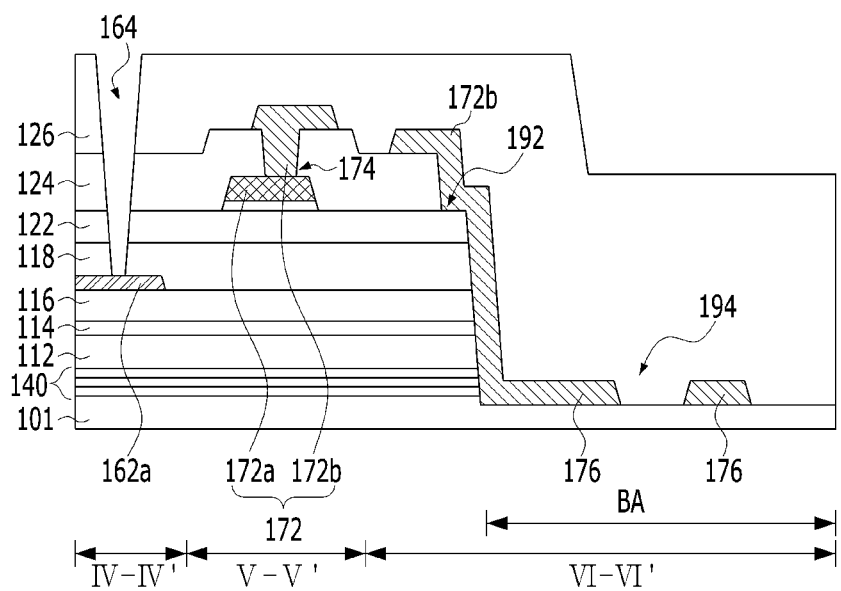

Referring to FIG. 9I, a first planarization layer 126 having a first pixel contact hole 120 and a first line contact hole 164 is formed on the substrate 101, on which the first and second source electrodes 156 and 106, the first and second drain electrodes 158 and 108, the storage supply line 186, the second high-potential supply line 172b, and the signal link 176 are formed.

Specifically, an organic dielectric material, such as an acrylic resin, is deposited on the entire surface of the substrate 101, on which the first and second source electrodes 156 and 106, the first and second drain electrodes 158 and 108, the storage supply line 186, the second high-potential supply line 172b, and the signal link 176 are formed, in order to form a first planarization layer 126. Subsequently, the first planarization layer 126 is patterned through a photolithography process using a ninth mask in order to form a first pixel contact hole 120. At the same time, the first line contact hole 164 is formed through the first planarization layer 126.

Figure 9J:
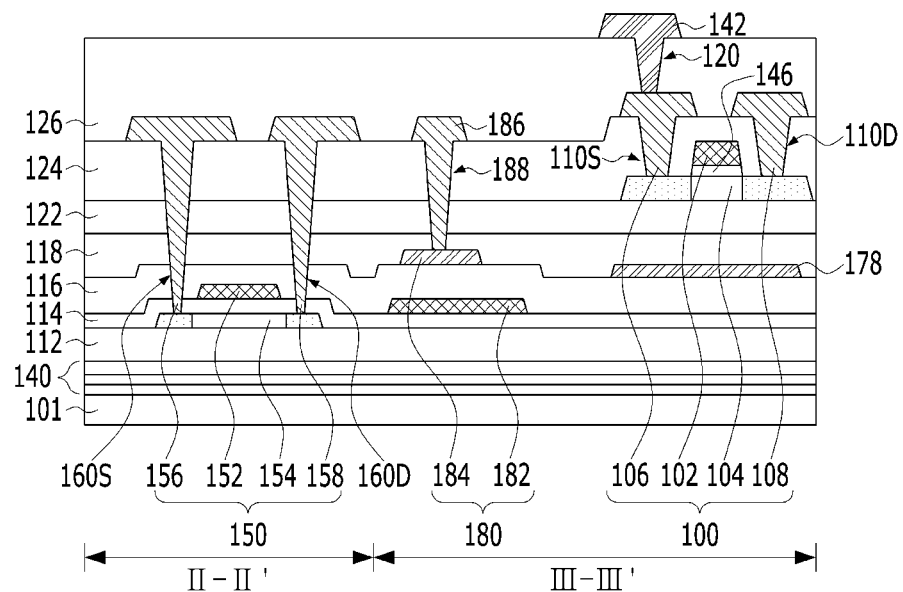
Figure 9J:
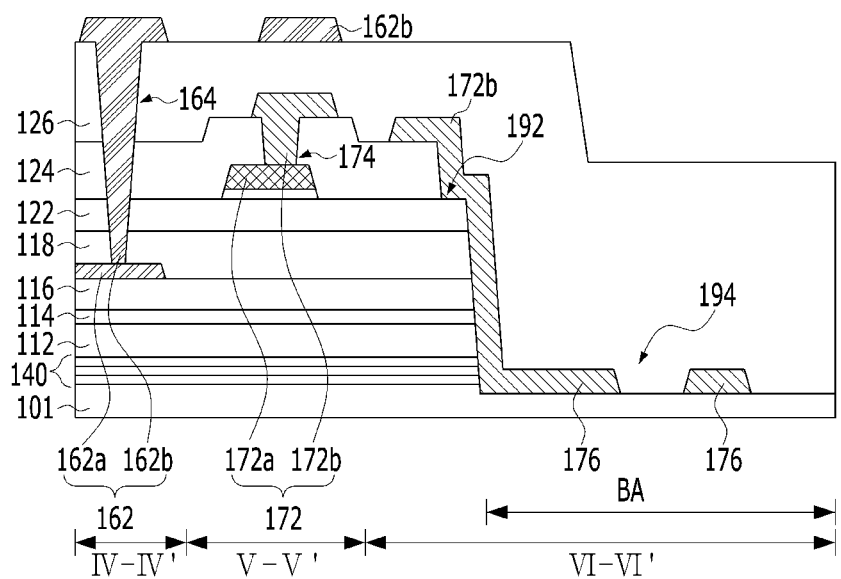

Referring to FIG. 9J, a pixel connection electrode 142 and a second low-potential supply line 162b are formed on the substrate 101, on which the first planarization layer 126 is formed.

Specifically, a fifth conductive layer, made of Mo, Ti, Cu, AlNd, Al, Cr, or an alloy thereof, is deposited on the entire surface of the substrate 101, on which the first planarization layer 126 is formed. Subsequently, the fifth conductive layer is patterned through a photolithography and etching process using a tenth mask in order to form a pixel connection electrode 142 and a second low-potential supply line 162b.

Figure 9K:
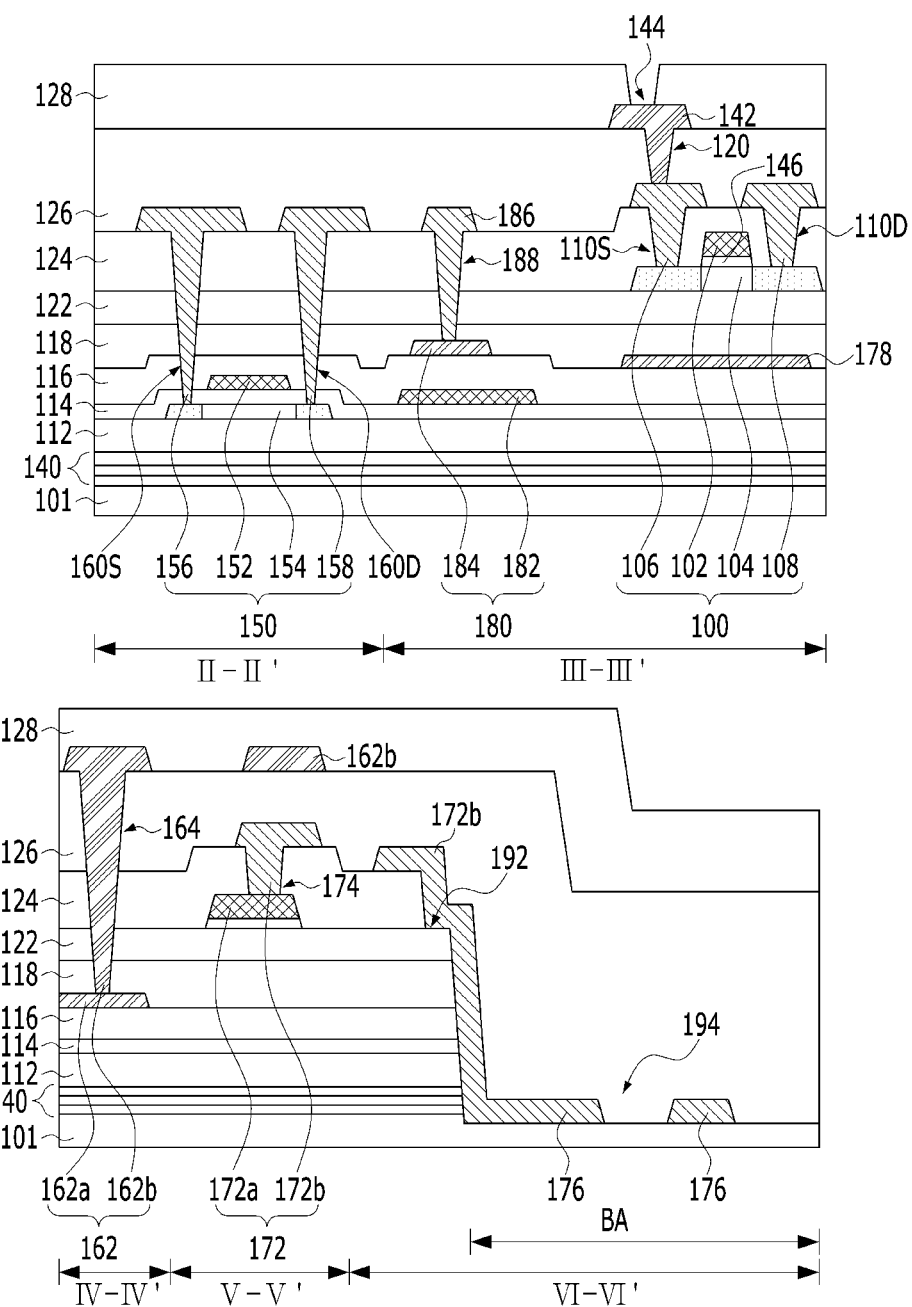

Referring to FIG. 9K, a second planarization layer 128 having a second pixel contact hole 144 is formed on the substrate 101, on which the pixel connection electrode 142 and the second low-potential supply line 162b are formed.

Specifically, an organic dielectric material, such as an acrylic resin, is deposited on the entire surface of the substrate 101, on which the pixel connection electrode 142 and the second low-potential supply line 162b are formed, in order to form a second planarization layer 128. Subsequently, the second planarization layer 128 is patterned through a photolithography process using an eleventh mask in order to form a second pixel contact hole 144.

Figure 9L:
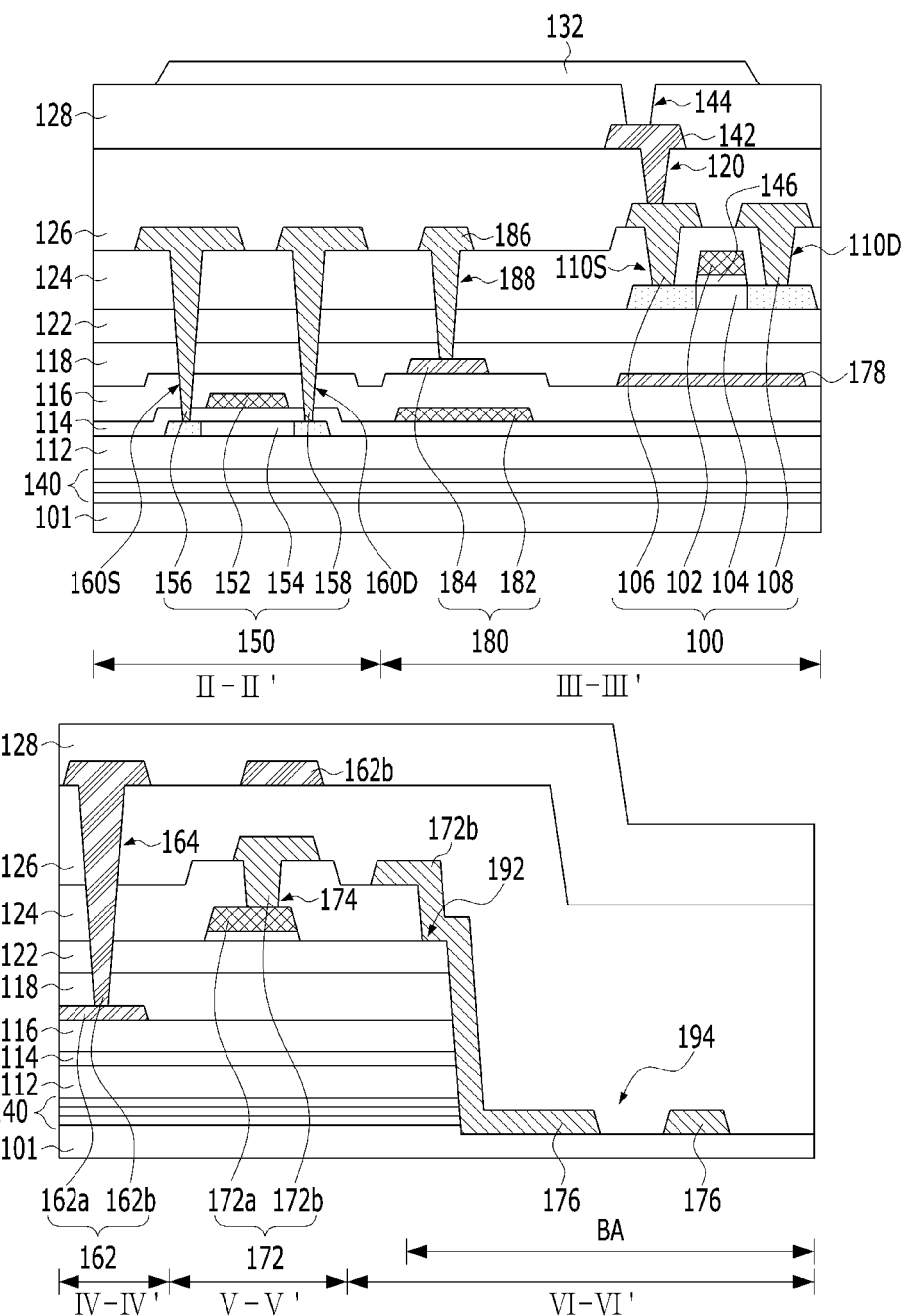

Referring to FIG. 9L, an anode 132 is formed on the substrate 101, on which the second planarization layer 128 having therein the second pixel contact hole 144 is formed.

Specifically, a fifth conductive layer is deposited on the entire surface of the substrate 101, on which the second planarization layer 128 having therein the second pixel contact hole 144 is formed. A transparent conductive film or an opaque conductive film is used as the fifth conductive layer. Subsequently, the fifth conductive layer is patterned through a photolithography and etching process using a twelfth mask in order to form an anode 132.

Figure 9M:
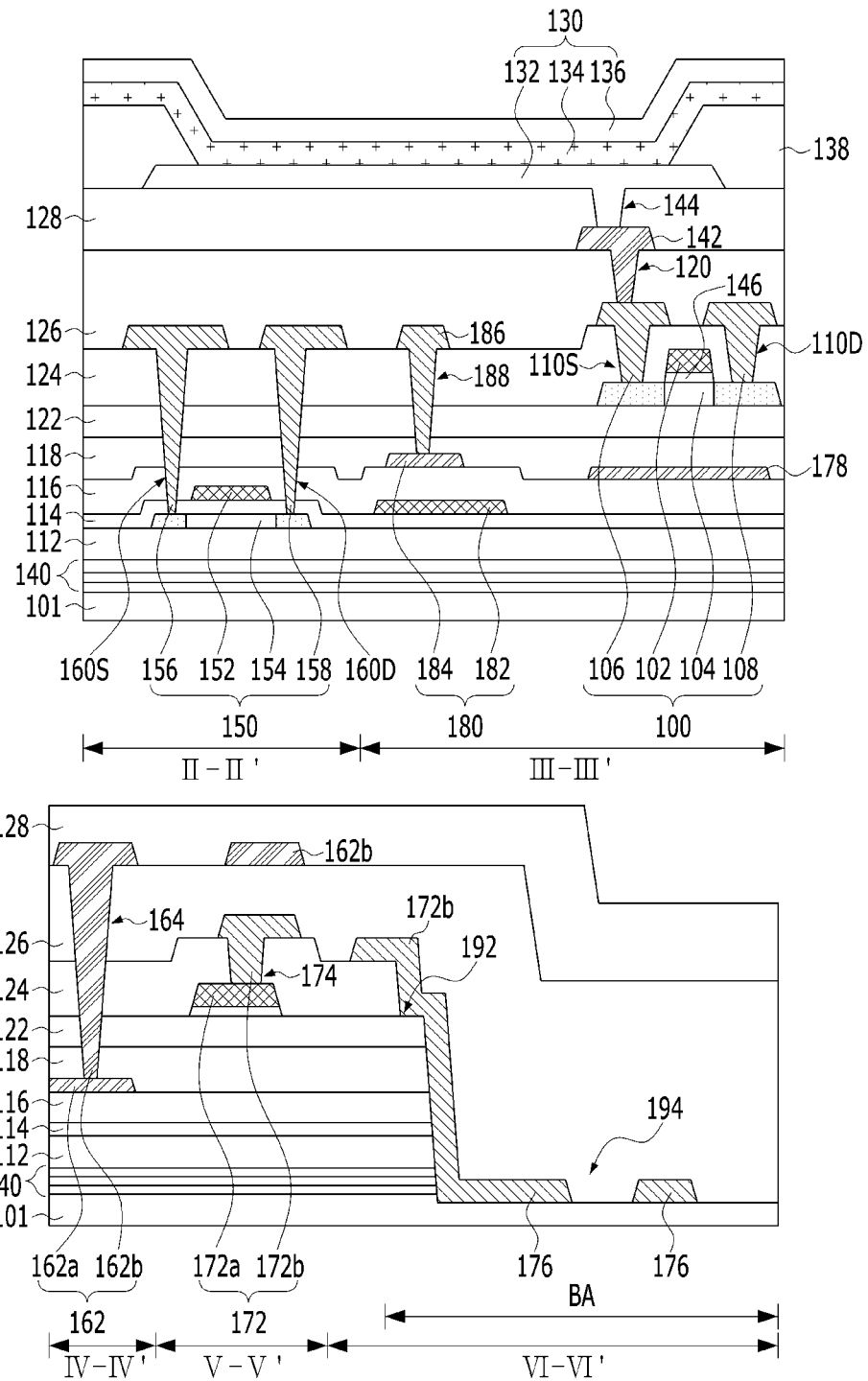

Referring to FIG. 9M, a bank 138, an organic light-emitting stack 134, and a cathode 136 are sequentially formed on the substrate 101, on which the anode 132 is formed.

Specifically, a photosensitive film for banks is applied to the entire surface of the substrate 101, on which the anode 132 is formed, and the photosensitive film for banks is patterned through a photolithography process using a thirteenth mask in order to form a bank 138. Subsequently, an organic light-emitting stack 134 and a cathode 136 are sequentially formed in an active area (AA), excluding a non-active area (NA), through a deposition process using a shadow mask.

According to the present disclosure, as described above, the first opening 192 in the bending area BA and the second source and drain contact holes 110S and 110D are formed through the same mask process, the second opening 194 in the bending area BA and the first source and drain contact holes 160S and 160D are formed through the same mask process, the first source and first drain electrodes 156 and 158 and the second source and second drain electrodes 106 and 108 are formed through the same mask process, and the storage contact hole 188 and the first source and drain contact holes 160S and 160D are formed through the same mask process, whereby the number of mask processes may be reduced by at least four compared to the conventional art. In the organic light-emitting display device according to the present disclosure, therefore, it is possible to eliminate at least four mask processes that are normally performed in the conventional art, whereby it is possible to simplify the structure and manufacturing process of the display device and thus to improve productivity.

As is apparent from the above description, according to the present disclosure, a second thin film transistor having an oxide semiconductor layer is applied to a drive transistor of each subpixel, and a first thin film transistor having a polycrystalline semiconductor layer is applied to a switching transistor of each subpixel, whereby it is possible to reduce power consumption. In addition, according to the present disclosure, openings disposed in a bending area and a plurality of contact holes disposed in an active area are formed through the same mask process, whereby the openings and the contact holes have the same depth. Consequently, it is possible to simplify the structure and manufacturing process of the display device according to the present disclosure and thus to improve productivity.

It will be apparent to those skilled in the art that various modifications and variations can be made in the present disclosure without departing from the spirit or scope of the invention. Thus, it is intended that the present disclosure covers the modifications and variations of this invention provided they come within the scope of the appended claims and their equivalents.

What is claimed is:

1. A display device comprising:
a substrate comprising an active area and a bending area;
a first inorganic dielectric film on the substrate, the first inorganic dielectric film comprising at least one inorganic dielectric layer;
a first thin film transistor disposed on the first inorganic dielectric film in the active area, the first thin film transistor comprising a first semiconductor layer disposed on the first inorganic dielectric film, a first source electrode, and a first drain electrode;
a second thin film transistor disposed above the first inorganic dielectric film in the active area, the second thin film transistor comprising a second semiconductor layer, a second source electrode, and a second drain electrode;
a second inorganic dielectric film disposed between the first semiconductor layer and the second semiconductor layer, the second inorganic dielectric film comprising at least one inorganic dielectric layer including an upper buffer layer that the second semiconductor layer is disposed thereon;

a third inorganic dielectric film disposed between the second source electrode, the second drain electrode, and the second semiconductor layer, the third inorganic dielectric film comprising at least one inorganic dielectric layer;

a first source contact hole and a first drain contact hole through the second inorganic dielectric film and the third inorganic dielectric film;

a second source contact hole and a second drain contact hole through the third inorganic dielectric film; and at least one opening disposed in the bending area, wherein the at least one opening comprises:
- a first opening through the third inorganic dielectric film disposed in the bending area, the first opening exposing a part of a top surface of the upper buffer layer; and
- a second opening through the first inorganic dielectric film, the second inorganic dielectric film, and the third inorganic dielectric film in the bending area, the second opening exposing the substrate.

2. The display device according to claim 1, wherein the first opening has a same depth as the second source contact hole and the second drain contact hole; and the second opening has a greater depth than the first source contact hole and the first drain contact hole.

3. The display device according to claim 1, wherein the third inorganic dielectric film includes:

an upper interlayer dielectric film disposed between each of the second source electrode, the second drain electrode, and the second semiconductor layer; and wherein the second inorganic dielectric film includes a lower gate dielectric film, a first lower interlayer dielectric film, a second lower interlayer dielectric film, and an upper buffer layer sequentially stacked between the first semiconductor layer and the second semiconductor layer, wherein the first source contact hole and the first drain contact hole are through the lower gate dielectric film, the first lower interlayer dielectric film, the second lower interlayer dielectric film, the upper buffer layer, and the upper interlayer dielectric film such that the first semiconductor layer is exposed, and wherein the second source contact hole and the second drain contact hole are through the upper interlayer dielectric film such that the second semiconductor layer is exposed.

4. The display device according to claim 3, wherein the first inorganic dielectric film includes:

a multi buffer layer disposed on the substrate; and a lower buffer layer disposed on the multi buffer layer, wherein the first opening is through the upper interlayer dielectric film disposed in the bending area, wherein the second opening is through the multi buffer layer, the lower buffer layer, the lower gate dielectric film, the first lower interlayer dielectric film, the second lower interlayer dielectric film, and the upper buffer layer disposed in the bending area, and wherein the substrate in the bending area is exposed through the first opening and the second opening.

5. The display device according to claim 3, wherein the first source electrode and the second source electrode are in a same plane as the first drain electrode and the second drain electrode on the upper interlayer dielectric film, and are made of a same material as the first drain electrode and the second drain electrode.

6. The display device according to claim 3, further comprising:

a storage lower electrode disposed on the lower gate dielectric film; and a storage upper electrode overlapping the storage lower electrode such that the first lower interlayer dielectric film is disposed there between, wherein the storage lower electrode is formed in a same plane as a first gate electrode of the first thin film transistor, and comprises a same material as the first gate electrode.

7. The display device according to claim 3, further comprising:

an organic light-emitting device connected to the second thin film transistor;

a low-potential supply line connected to a cathode of the organic light-emitting device; and a high-potential supply line overlapping the low-potential supply line, wherein at least one of the low-potential supply line or the high-potential supply line comprises a mesh shape.

8. The display device according to claim 7, further comprising:

a first planarization layer disposed on the upper interlayer dielectric film;

a pixel connection electrode disposed on the first planarization layer, the pixel connection electrode contacting the second source electrode; and a second planarization layer disposed covering the pixel connection electrode.

9. The display device according to claim 8, wherein the low-potential supply line comprises a first low-potential supply line and a second low-potential supply line that intersects the first low-potential supply line, and the high-potential supply line comprises a first high-potential supply line disposed parallel to the first low-potential supply line and a second high-potential supply line overlapping the second low-potential supply line such that the first planarization layer is disposed there between.

10. The display device according to claim 9, wherein the second low-potential supply line is in a same plane as the pixel connection electrode, and comprises a same material as the pixel connection electrode, and the second high-potential supply line is in a same plane as the second source electrode and the second drain electrode, and comprises a same material as the second source electrode and the second drain electrode.

11. The display device according to claim 8, further comprising:

a signal link disposed on the substrate in the bending area exposed through the at least one opening such that the signal link contacts the substrate, the signal link comprising a same material as the first source electrode and the second source electrode, wherein at least one of the first planarization layer and the second planarization layer are disposed covers the signal link.

12. The display device according to claim 8, further comprising:

a signal link disposed on the first planarization layer in the bending area exposed through the at least one opening, the signal link comprising a same material as the pixel connection electrode, wherein the second planarization layer covers the signal link.

13. The display device according to claim 7, further comprising:

a pixel-driving circuit configured to drive the organic light-emitting device, the second thin film transistor is a drive transistor and the first thin film transistor is a switching transistor.

14. The display device according to claim 13, wherein the pixel-driving circuit further comprises:
- a second switching transistor, the second switching transistor connected to the drive transistor; and
- a third switching transistor, the third switching transistor connected to the high-potential supply line.

15. The display device according to claim 1, wherein the first semiconductor layer includes a polycrystalline semiconductor layer and the second semiconductor layer includes an oxide semiconductor layer.

16. The display device according to claim 1, further comprising:
- a first planarization layer disposed at the at least one opening,
- wherein the at least one opening exposes a lateral surface of the first inorganic dielectric film, the second inorganic dielectric film, and the third inorganic dielectric film; and
- wherein the first planarization layer is disposed on the lateral surface of the first inorganic dielectric film, the second inorganic dielectric film and the third inorganic dielectric film, and comprises a dielectric material.

\* \* \* \* \*